(12) United States Patent
Kasahara et al.

(10) Patent No.: US 10,724,902 B2
(45) Date of Patent: Jul. 28, 2020

(54) FABRY-PEROT INTERFERENCE FILTER

(71) Applicant: HAMAMATSU PHOTONICS K.K., Hamamatsu-shi, Shizuoka (JP)

(72) Inventors: Takashi Kasahara, Hamamatsu (JP); Katsumi Shibayama, Hamamatsu (JP); Masaki Hirose, Hamamatsu (JP); Toshimitsu Kawai, Hamamatsu (JP); Hiroki Oyama, Hamamatsu (JP); Yumi Kuramoto, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 16/322,170

(22) PCT Filed: Jul. 5, 2017

(86) PCT No.: PCT/JP2017/024645
§ 371 (c)(1),
(2) Date: Jan. 31, 2019

(87) PCT Pub. No.: WO2018/037724
PCT Pub. Date: Mar. 1, 2018

(65) Prior Publication Data
US 2019/0186994 A1 Jun. 20, 2019

(30) Foreign Application Priority Data
Aug. 24, 2016 (JP) .................................. 2016-163916

(51) Int. Cl.
*G01J 3/26* (2006.01)
*B81B 3/00* (2006.01)
(Continued)

(52) U.S. Cl.
CPC .................. *G01J 3/26* (2013.01); *B81B 3/00* (2013.01); *G02B 5/28* (2013.01); *G02B 26/00* (2013.01); *G02B 26/0816* (2013.01)

(58) Field of Classification Search
CPC .. G01J 3/26; G01J 3/0243; B81B 3/00; B81B 3/0072; G02N 5/28; G02N 26/00;
(Continued)

(56) References Cited

U.S. PATENT DOCUMENTS 6,436,794 B1    8/2002  Lee et al.
2003/0116711 A1  6/2003  Hara et al.
(Continued)

FOREIGN PATENT DOCUMENTS

EP    3 018 521 A1    5/2016
EP    3 467 567 A1    4/2019
(Continued)

OTHER PUBLICATIONS

International Preliminary Report on Patentability dated Dec. 6, 2018 for PCT/JP2017/017167.
(Continued)

*Primary Examiner* — Dominic J Bologna
(74) *Attorney, Agent, or Firm* — Faegre Drinker Biddle & Reath LLP

(57) ABSTRACT

A Fabry-Perot interference filter includes a substrate that has a first surface, a first laminate that has a first mirror portion disposed on the first surface, a second laminate that has a second mirror portion facing the first mirror portion via a gap on a side opposite to the substrate with respect to the first mirror portion, and an intermediate layer that defines the gap between the first laminate and the second laminate. An outer surface of the intermediate layer is curved such that an edge portion of the intermediate layer on the substrate side is positioned on an outer side of an edge portion of the
(Continued)

intermediate layer on the side opposite to the substrate in a direction parallel to the first surface. The second laminate covers the outer surface of the intermediate layer.

7 Claims, 24 Drawing Sheets

(51) Int. Cl.
*G02B 26/00* (2006.01)
*G02B 5/28* (2006.01)
*G02B 26/08* (2006.01)

(58) Field of Classification Search
CPC .. G02N 26/0816; B23K 26/064; B23K 26/53; B23K 26/0006; B23K 26/0643; B23K 2101/56; B23K 2101/40; B81C 1/00539; B81C 1/00634; G02B 5/284; G02B 26/001
See application file for complete search history.

(56) References Cited

U.S. PATENT DOCUMENTS

| | | | |
|---|---|---|---|
| 2006/0110851 A1 | 5/2006 | Burrell et al. | |
| 2007/0041076 A1* | 2/2007 | Zhong | B81B 3/0072 359/290 |
| 2007/0057999 A1* | 3/2007 | Kuroda | B41J 2/14314 347/55 |
| 2007/0202628 A1* | 8/2007 | Wuertz | B81C 1/00246 438/53 |
| 2009/0109423 A1 | 4/2009 | Carr | |
| 2010/0015782 A1 | 1/2010 | Yu et al. | |
| 2012/0287138 A1 | 11/2012 | Zhong et al. | |
| 2013/0059428 A1 | 3/2013 | Arai | |
| 2013/0329232 A1 | 12/2013 | Antila et al. | |
| 2014/0111811 A1 | 4/2014 | Tuohiniemi | |
| 2015/0138642 A1 | 5/2015 | Banerjee et al. | |
| 2015/0311664 A1 | 10/2015 | Bulovic et al. | |
| 2016/0370573 A1* | 12/2016 | Shibayama | G02B 26/001 |

FOREIGN PATENT DOCUMENTS

| | | |
|---|---|---|
| EP | 3 505 987 A1 | 7/2019 |
| EP | 3 505 988 A1 | 7/2019 |
| JP | 2007-36233 A | 2/2007 |
| JP | 2007-77864 A | 3/2007 |
| JP | 2008-103776 A | 5/2008 |
| JP | 2009-505162 A | 2/2009 |
| JP | 2009-81428 A | 4/2009 |
| JP | 2009-147108 A | 7/2009 |
| JP | 2011-27923 A | 2/2011 |
| JP | 2011-87272 A | 4/2011 |
| JP | 2011-181909 A | 9/2011 |
| JP | 2012-528345 A | 11/2012 |
| JP | 2013-506154 A | 2/2013 |
| JP | 2013-257561 A | 12/2013 |
| JP | 2015-11311 A | 1/2015 |
| JP | 2015-011312 A | 1/2015 |
| JP | 2015-521401 A | 7/2015 |
| JP | 2015-152713 A | 8/2015 |
| JP | 2015-199071 A | 11/2015 |
| JP | 2016-99583 A | 5/2016 |
| WO | WO-2007/022476 A1 | 2/2007 |
| WO | WO 2007/107176 A1 | 9/2007 |
| WO | WO-2010/086502 A1 | 8/2010 |
| WO | WO-2010/136654 A1 | 12/2010 |
| WO | WO-2011/036346 A1 | 3/2011 |
| WO | WO-2015/122316 A1 | 8/2015 |
| WO | WO-2015/195123 A1 | 12/2015 |

OTHER PUBLICATIONS

International Preliminary Report on Patentability dated Dec. 6, 2018 for PCT/JP2017/017172.
International Preliminary Report on Patentability dated Dec. 6, 2018 for PCT/JP2017/019680.
International Preliminary Report on Patentability dated Mar. 7, 2019 for PCT/JP2017/024645.
A. Rissanen et al., "Tunable MOEMS Fabry-Perot interferometer for miniaturized spectral sensing in near-infrared", Proceedings of SPIE/ IS & T, vol. 8977, Mar. 7, 2014, p. 89770X, XP060034717.
S. Sullivan et al., "Non-Traditional Dicing of MEMS Devices", NSTI-Nanotech 2008, Jan. 1, 2008, XP055144278.
A. Hooper et al., "Review of wafer dicing techniques for via-middle process 3DI/TSV ultrathin silicon device wafers", 2015 IEEE 65th Electronic Components and Technology Conference (ECTC), IEEE, May 26, 2015, p. 1436-p. 1446, XP033175240.

\* cited by examiner

FABRY-PEROT INTERFERENCE FILTER

TECHNICAL FIELD

An aspect of the present invention relates to a Fabry-Perot interference filter.

BACKGROUND ART

Patent Literature 1 discloses a Fabry-Perot interferometer including a substrate, a first mirror structure that has a lower fixed mirror disposed on the substrate, a second mirror structure that has an upper movable mirror facing the lower fixed mirror via a space, and a sacrificial layer that defines the space between the first mirror structure and the second mirror structure. In this Fabry-Perot interferometer, an outer surface of the sacrificial layer is exposed. In addition, the outer surface of the sacrificial layer exhibits a flat surface shape, is orthogonal to a surface on a side opposite to the first mirror structure in the sacrificial layer, and is flush with an outer surface of the second mirror structure.

CITATION LIST

Patent Literature

Patent Literature 1: PCT Japanese Translation Patent Publication No. 2012-528345

SUMMARY OF INVENTION

Technical Problem

In a Fabry-Perot interferometer as described above, since an outer surface of a sacrificial layer is exposed, light is incident from the outer surface of the sacrificial layer. Even if such light has a wavelength different from a wavelength corresponding to a distance between a lower fixed mirror and an upper movable mirror, there is concern that the light may be transmitted through the lower fixed mirror and may be incorporated into light output from the Fabry-Perot interferometer. In this case, noise in output light increases, so that characteristics of the Fabry-Perot interferometer deteriorate.

In addition, in a Fabry-Perot interferometer as described above, in a state in which a second mirror structure is supported by the sacrificial layer, the upper movable mirror moves to the lower fixed mirror side due to an electrostatic force. Consequently, when the upper movable mirror moves to the lower fixed mirror side, a force acts toward the upper movable mirror side with respect to a region of the second mirror structure supported by the sacrificial layer. Then, due to reaction of the force, stress acts on a region of the sacrificial layer supporting the upper movable mirror. Particularly, in this Fabry-Perot interferometer, the outer surface of the sacrificial layer exhibits a flat surface shape, is orthogonal to a surface on a side opposite to a first mirror structure in the sacrificial layer, and is flush with an outer surface of the second mirror structure. Consequently, stress is likely to be concentrated on the outer surface of the sacrificial layer in a corner portion on the second mirror structure side. As a result, there is concern that damage such as a crack may be caused in the corner portion.

Accordingly, an object of an aspect of the present invention is to provide a Fabry-Perot interference filter in which high reliability can be achieved.

Solution to Problem

According to an aspect of the present invention, there is provided a Fabry-Perot interference filter including a substrate that has a first surface, a first layer that has a first mirror portion disposed on the first surface, a second layer that has a second mirror portion facing the first mirror portion via a gap on a side opposite to the substrate with respect to the first mirror portion, and an intermediate layer that defines the gap between the first layer and the second layer. An outer surface of the intermediate layer is curved such that an edge portion of the intermediate layer on the substrate side is positioned on an outer side of an edge portion of the intermediate layer on the side opposite to the substrate in a direction parallel to the first surface. The second layer covers the outer surface of the intermediate layer.

In this Fabry-Perot interference filter, the second layer covers the outer surface of the intermediate layer. Consequently, noise can be prevented from being increased in light output from the Fabry-Perot interference filter due to incident light from the outer surface of the intermediate layer. Therefore, characteristics of the Fabry-Perot interference filter can be prevented from deteriorating. Incidentally, in this Fabry-Perot interference filter, since the second layer covers the outer surface of the intermediate layer, when the second mirror portion moves to the first mirror portion side, a force also acts toward the second mirror portion side with respect to a region of the second layer covering the outer surface of the intermediate layer. Therefore, stress is likely to be concentrated in a corner portion on the outer surface of the intermediate layer on the second layer side. Here, in this Fabry-Perot interference filter, the outer surface of the intermediate layer is curved such that the edge portion of the intermediate layer on the substrate side is positioned on the outer side of the edge portion of the intermediate layer on the side opposite to the substrate in the direction parallel to the first surface. Consequently, stress can be dispersed in the corner portion on the outer surface of the intermediate layer on the second layer side. Therefore, damage such as a crack can be prevented from being caused in the corner portion. As described above, according to this Fabry-Perot interference filter, high reliability can be achieved.

In the Fabry-Perot interference filter according to the aspect of the present invention, the outer surface of the intermediate layer may be curved in a recessed shape on the gap side such that the edge portion of the intermediate layer on the substrate side is positioned on the outer side of the edge portion of the intermediate layer on the side opposite to the substrate in the direction parallel to the first surface. In this case, the angle of the outer surface of the intermediate layer with respect to the first surface decreases in a part close to the substrate on the outer surface of the intermediate layer while becoming close to the substrate in the direction perpendicular to the first surface. Accordingly, the second layer can be prevented from peeling from a part close to the substrate on the outer surface of the intermediate layer.

In the Fabry-Perot interference filter according to the aspect of the present invention, the outer surface of the intermediate layer may be curved so as to be away from the gap in the direction parallel to the first surface while becoming close to the substrate in a direction perpendicular to the first surface. In this case, the outer surface of the intermediate layer in its entirety is separated from the gap in the direction parallel to the first surface while becoming close to the substrate in the direction perpendicular to the first surface. Accordingly, stress can be further dispersed in the corner portion on the outer surface of the intermediate layer on the second layer side.

In the Fabry-Perot interference filter according to the aspect of the present invention, an outer surface of the first layer may be positioned on the outer side of the outer surface of the intermediate layer in the direction parallel to the first surface. The second layer may cover the outer surface of the first layer. In this case, the second layer covers a range to the outer surface of the first layer beyond the outer surface of the intermediate layer and is fixed to the outer surface of the first layer. Thus, the second layer can be prevented from peeling from a part close to the substrate on the outer surface of the intermediate layer.

In the Fabry-Perot interference filter according to the aspect of the present invention, the substrate may have an outer edge portion positioned on the outer side of an outer edge of the first layer in a case of being seen in the direction perpendicular to the first surface. The second layer may cover the outer edge portion. In this case, the second layer covers a range to the outer edge portion of the substrate beyond the outer edge of the first layer, so that the first layer is fixed to the substrate side. Thus, the first layer can be prevented from peeling from the substrate side.

In the Fabry-Perot interference filter according to the aspect of the present invention, the outer surface of the first layer may be curved so as to be away from the gap in the direction parallel to the first surface while becoming close to the substrate in the direction perpendicular to the first surface. In this case, the second layer is more firmly fixed to the outer surface of the first layer. Thus, the second layer can be more reliably prevented from peeling from a part close to the substrate on the outer surface of the intermediate layer.

According to the aspect of the present invention, the Fabry-Perot interference filter may further include a third layer that is disposed on a second surface opposite to the first surface in the substrate. In this case, it is possible to reduce stress caused by discordance of a layer configuration between the first surface side and the second surface side of the substrate. Therefore, concentration of stress in the intermediate layer can be further prevented.

Advantageous Effects of Invention

According to the aspect of the present invention, it is possible to provide a Fabry-Perot interference filter in which high reliability can be achieved.

DESCRIPTION OF EMBODIMENT

Hereinafter, an embodiment of the present invention will be described in detail with reference to the drawings. In the following description, the same reference signs will be applied to the same or equivalent elements, and duplicated description will be omitted.

Figure 1:
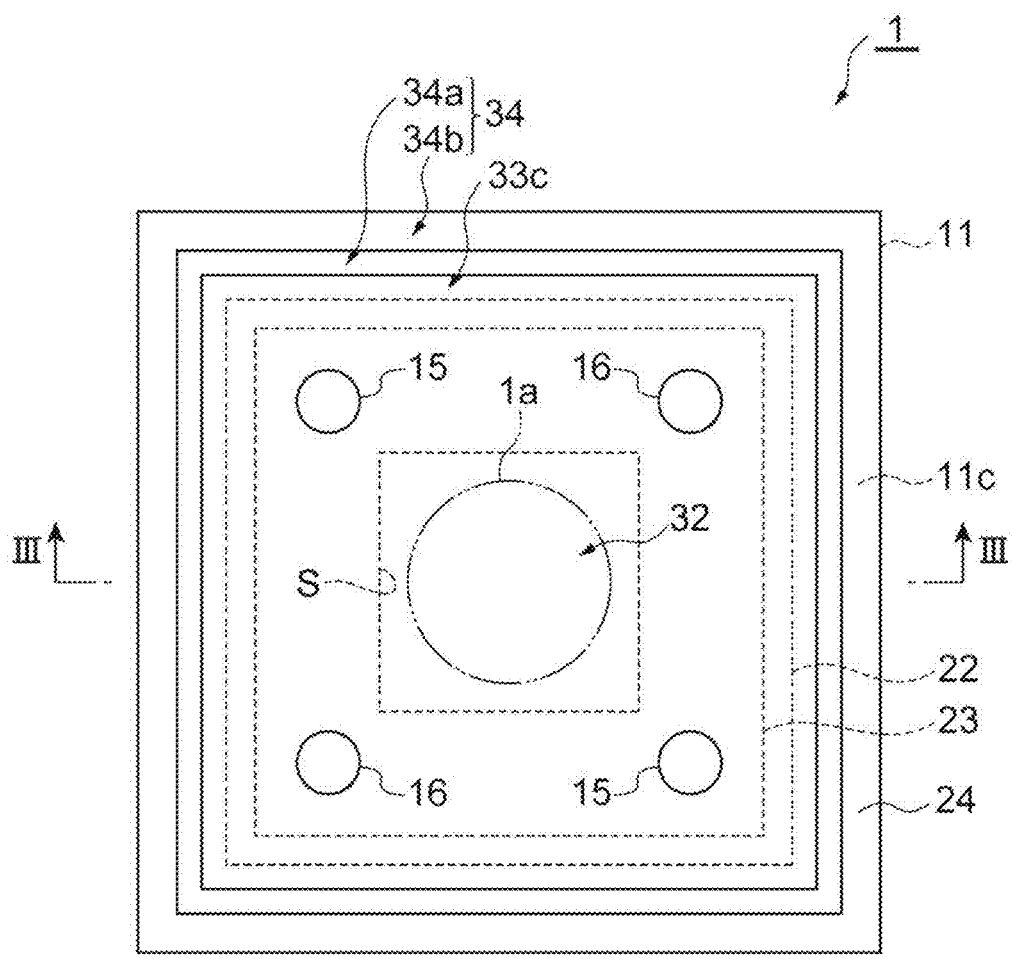
FIG. 1 is a plan view of a Fabry-Perot interference filter according to an embodiment of the present invention.
Figure 2:
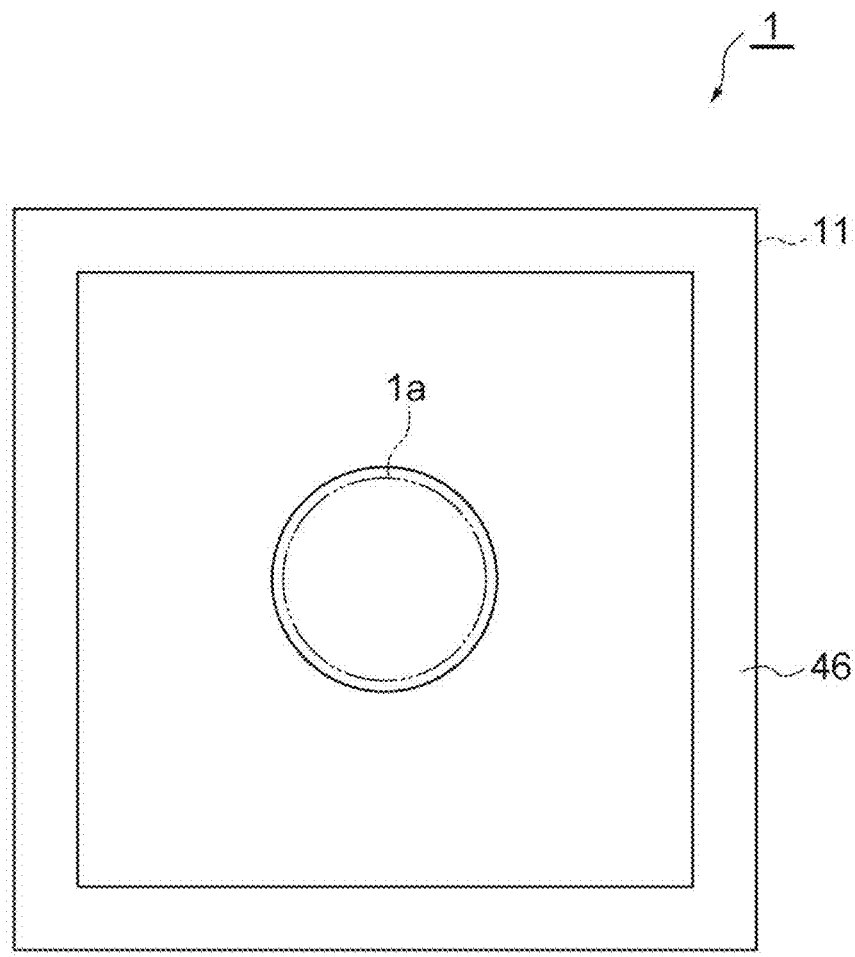
FIG. 2 is a bottom view of the Fabry-Perot interference filter in FIG. 1.
Figure 3:
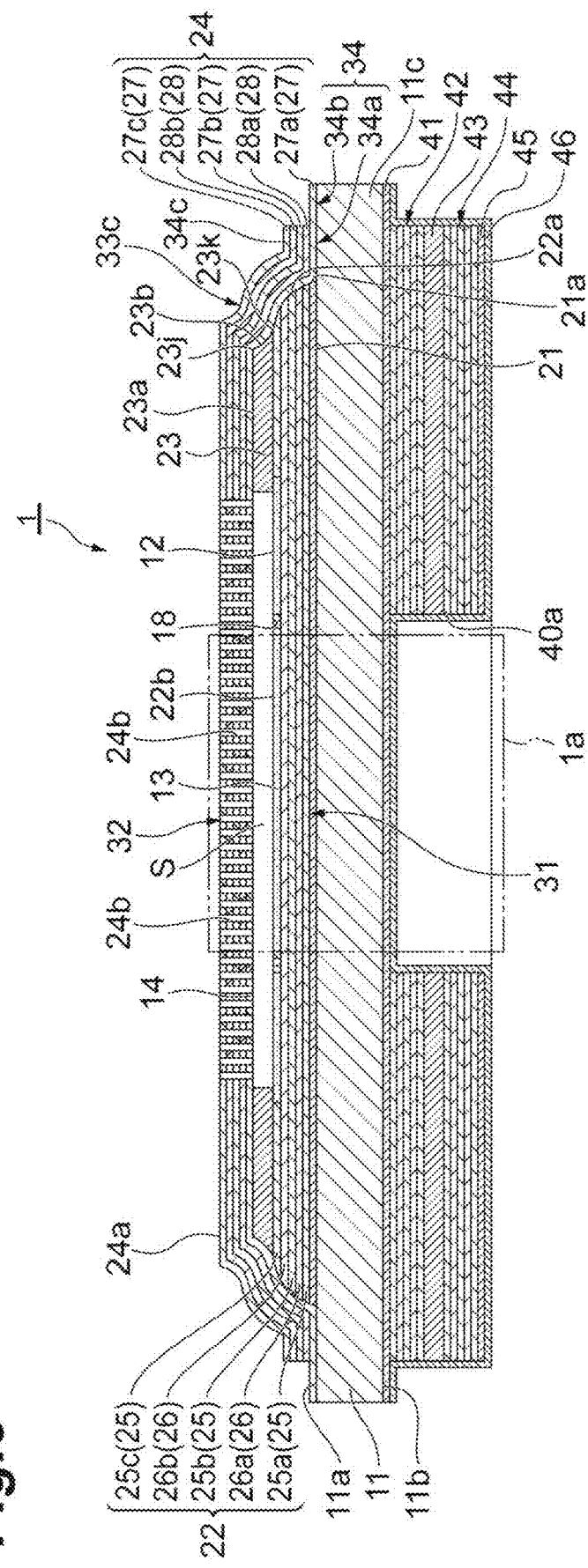
FIG. 3 is a cross-sectional view of the Fabry-Perot interference filter taken along line III-III in FIG. 1.

As illustrated in FIGS. 1, 2, and 3, a Fabry-Perot interference filter 1 includes a substrate 11. The substrate 11 has a first surface 11a and a second surface 11b opposite to the first surface 11a. On the first surface 11a, a reflection prevention layer 21, a first laminate (first layer) 22, an intermediate layer 23, and a second laminate (second layer) 24 are laminated in this order. A gap (air gap) S is defined between the first laminate 22 and the second laminate 24 by the frame-shaped intermediate layer 23. In addition, first terminals 15 and second terminals 16 are provided on the first surface 11a side of the Fabry-Perot interference filter 1. In the following description, a direction toward the gap S side from a side opposite to the gap S with respect to the frame-shaped intermediate layer 23 will be referred to as an "inner side". In addition, a direction toward the side opposite to the gap S from the gap S side with respect to the frame-shaped intermediate layer 23 will be referred to as an "outer side".

The shape and the positional relationship of each portion in a case of being seen in a direction perpendicular to the first surface 11a (plan view) are as follows. For example, an outer edge of the substrate 11 has a rectangular shape. The outer edge of the substrate 11 and an outer edge of the second laminate 24 coincide with each other. An outer edge of the reflection prevention layer 21 and an outer edge of the first laminate 22 coincide with each other. The outer edge of the reflection prevention layer 21 and the outer edge of the first laminate 22 are positioned on the outer side of an outer edge of the intermediate layer 23 with respect to a center portion of the gap S. The substrate 11 has an outer edge portion 11c positioned on the outer side of the outer edge of the first laminate 22. For example, the outer edge portion 11c has a frame shape and surrounds the first laminate 22 in a case of being seen in the direction perpendicular to the first surface 11a.

In the Fabry-Perot interference filter 1, light having a predetermined wavelength is transmitted through a light transmission region 1a defined in a center portion thereof. For example, the light transmission region 1a is a columnar region. For example, the substrate 11 is made of silicon, quartz, or glass. When the substrate 11 is made of silicon, the reflection prevention layer 21 and the intermediate layer 23 are made of silicon oxide, for example. The thickness of the intermediate layer 23 ranges from several tens of nm to several tens of μm, for example.

A part corresponding to the light transmission region 1a in the first laminate 22 functions as a first mirror portion 31. The first mirror portion 31 is disposed on the first surface 11a with the reflection prevention layer 21 interposed therebetween. The first laminate 22 is configured to have a plurality of polysilicon layers 25 and a plurality of silicon nitride layers 26 which are alternately laminated one by one. In the present embodiment, a polysilicon layer 25a, a silicon nitride layer 26a, a polysilicon layer 25b, a silicon nitride layer 26b, and a polysilicon layer 25e are laminated on the reflection prevention layer 21 in this order. The optical thickness of each of the polysilicon layers 25 and the silicon nitride layers 26 configuring the first mirror portion 31 is preferably an integer multiple of ¼ of a center transmission wavelength. The first mirror portion 31 may be directly disposed on the first surface 11a without the reflection prevention layer 21 interposed therebetween.

A part corresponding to the light transmission region 1a in the second laminate 24 functions as a second mirror portion 32. The second mirror portion 32 faces the first mirror portion 31 via the gap S on a side opposite to the substrate 11 with respect to the first mirror portion 31. The second mirror portion 32 is disposed on the first surface 11a with the reflection prevention layer 21, the first laminate 22, and the intermediate layer 23 interposed therebetween. The second laminate 24 is configured to include a plurality of polysilicon layers 27 and a plurality of silicon nitride layers 28 which are alternately laminated one by one. In the present embodiment, a polysilicon layer 27a, a silicon nitride layer 28a, a polysilicon layer 27b, a silicon nitride layer 28b, and a polysilicon layer 27c are laminated on the intermediate layer 23 in this order. The optical thickness of each of the polysilicon layers 27 and the silicon nitride layers 28 configuring the second mirror portion 32 is preferably an integer multiple of ¼ of the center transmission wavelength.

In the first laminate 22 and the second laminate 24, silicon oxide layers may be used in place of the silicon nitride layers. In addition, as the material of each layer configuring the first laminate 22 and the second laminate 24, titanium oxide, tantalum oxide, zirconium oxide, magnesium fluoride, aluminum oxide, calcium fluoride, silicon, germanium, zinc sulfide, or the like may be used.

In a part corresponding to the gap S in the second laminate 24, a plurality of through-holes 24b leading from a surface 24a of the second laminate 24 on a side opposite to the intermediate layer 23 to the gap S are formed. The plurality of through-holes 24b are formed so as not to substantially affect the function of the second mirror portion 32. The plurality of through-holes 24b are used for forming the gap S by removing a part of the intermediate layer 23 through etching.

A first electrode 12 is provided in the first laminate 22. More specifically, the first electrode 12 is formed in the first mirror portion 31 such that the light transmission region 1a is surrounded. The first electrode 12 is formed by doping impurities into the polysilicon layer 25c and decreasing resistance. A second electrode 13 is formed in the first mirror portion 31 such that the light transmission region 1a is included. The second electrode 13 is formed by doping impurities into the polysilicon layer 25c and decreasing resistance. The size the second electrode 13 is preferably a size for including the entirety of the light transmission region 1a. However, the size may be approximately the same as the size of the light transmission region 1a.

A third electrode 14 is provided in the second laminate 24. More specifically, the third electrode 14 is formed in the second mirror portion 32. The third electrode 14 faces the first electrode 12 and the second electrode 13 via the gap S. The third electrode 14 is formed by doping impurities into the polysilicon layer 27a and decreasing resistance.

Figure 4:
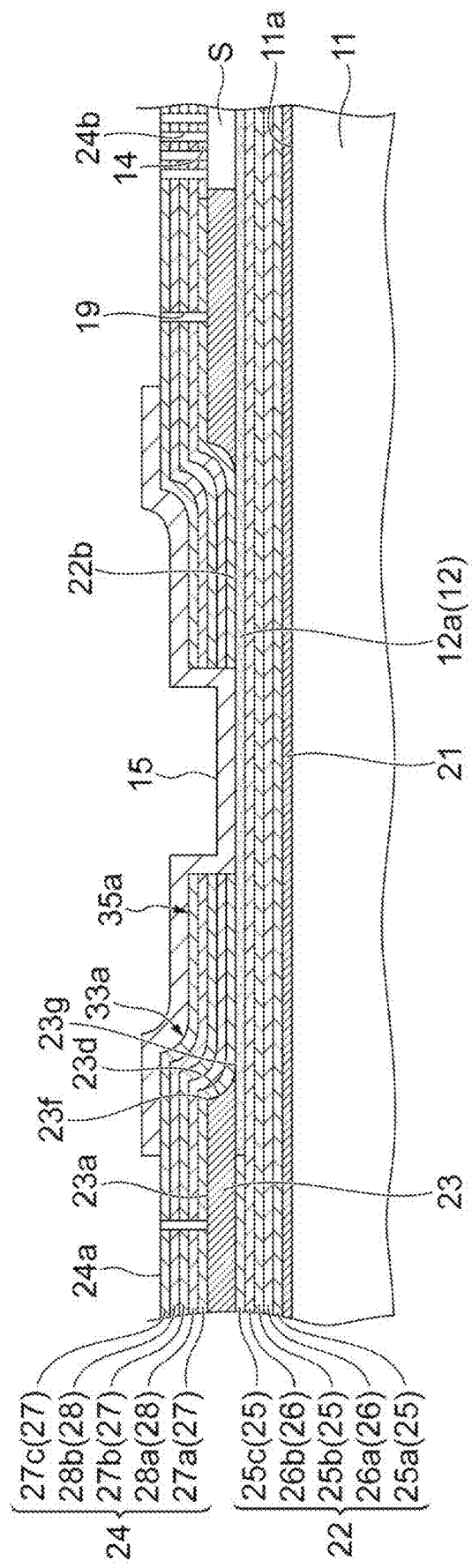
FIG. 4 is an enlarged cross-sectional view of a first terminal part of the Fabry-Perot interference filter in FIG. 1.

As illustrated in FIGS. 1 and 4, a pair of first terminals 15 is provided to face each other while having the light transmission region 1a therebetween. Each of the first terminals 15 is disposed inside a through-hole leading from the surface 24a of the second laminate 24 to the first laminate 22. Each of the first terminals 15 is electrically connected to the first electrode 12 through a wiring 12a. For example, the first terminals 15 are formed from a metal film made of aluminum or an alloy thereof.

Figure 5:
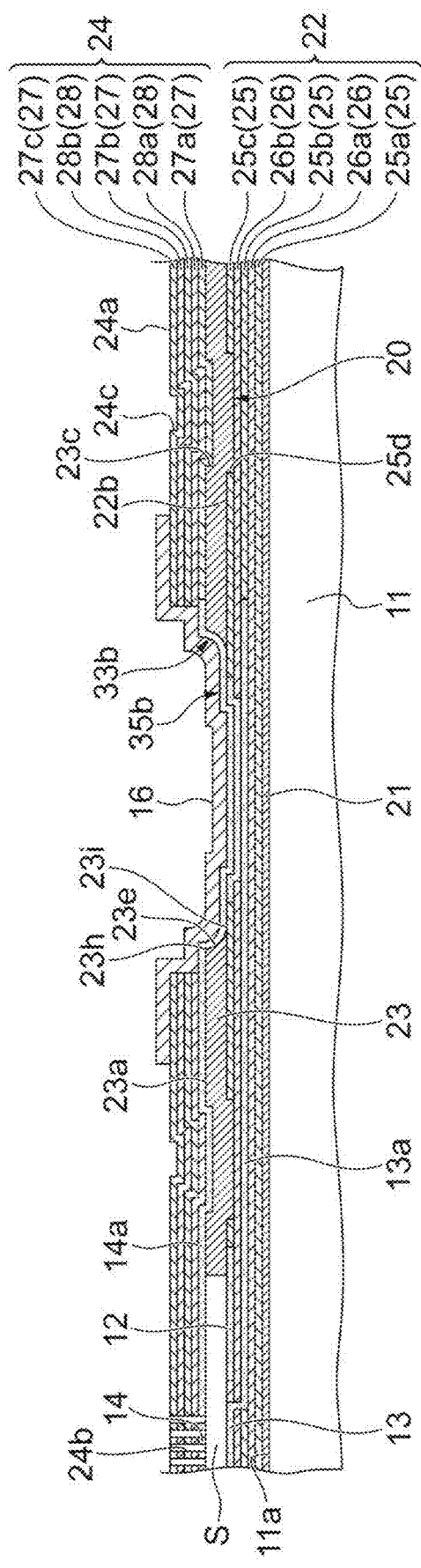
FIG. 5 is an enlarged cross-sectional view of a second terminal part of the Fabry-Perot interference filter in FIG. 1.

As illustrated in FIGS. 1 and 5, a pair of second terminals 16 is provided to face each other while having the light transmission region 1a therebetween. Each of the second terminals 16 is disposed inside a through-hole leading from the surface 24a of the second laminate 24 to the first laminate 22. Each of the second terminals 16 is electrically connected to the second electrode 13 through a wiring 13a and is electrically connected to the third electrode 14 through a wiring 14a.

For example, the second terminals 16 are formed from a metal film made of aluminum or an alloy thereof. The facing direction of the pair of first terminals 15 and the facing direction of the pair of second terminals 16 are orthogonal to each other.

As illustrated in FIGS. 3, 4, and 5, a trench 18 is provided on a surface 22b of the first laminate 22. The trench 18 annularly extends along an inner edge of the first electrode 12. The trench 18 electrically insulates the first electrode 12 and a region of the first electrode 12 on the inner side (second electrode 13). The region inside the trench 18 may be an insulating material or a gap.

A trench 19 is provided in the second laminate 24. The trench 19 annularly extends to surround the first terminals 15. The trench 19 electrically insulates the first terminals 15 and the third electrode 14. In the present embodiment, the region inside the trench 19 is a gap. However, the region may be an insulating material.

In addition, a trench 20 is provided on the surface 22b of the first laminate 22. The trench 20 annularly extends to surround the second terminals 16. The trench 20 electrically insulates the second terminals 16 and the first electrode 12. The trench 20 is constituted by causing the intermediate layer 23 to enter a groove portion 25d which is formed toward the substrate 11 side by removing a part of the polysilicon layer 25c configuring the first laminate 22. When the intermediate layer 23 enters the groove portion 25d, a surface 23a of the intermediate layer 23 forms a groove portion 23c toward the substrate 11 side in a region corresponding to the groove portion 25d. In addition, when the second laminate 24 enters the groove portion 23c, the surface 24a of the second laminate 24 forms a groove portion 24c toward the substrate 11 side in a region corresponding to the groove portion 23c. When the second laminate 24 enters the groove portion 23c in this way, the second laminate 24 is fixed to the surface 23a of the intermediate layer 23. Accordingly, the second laminate 24 is prevented from peeling from the intermediate layer 23. The trench 20 may be constituted by causing the intermediate layer 23 to enter a groove portion which is formed toward the substrate 11 side by removing a part of the silicon nitride layer 26b, in addition to a part of the polysilicon layer 25c configuring the first laminate 22.

Figure 6:
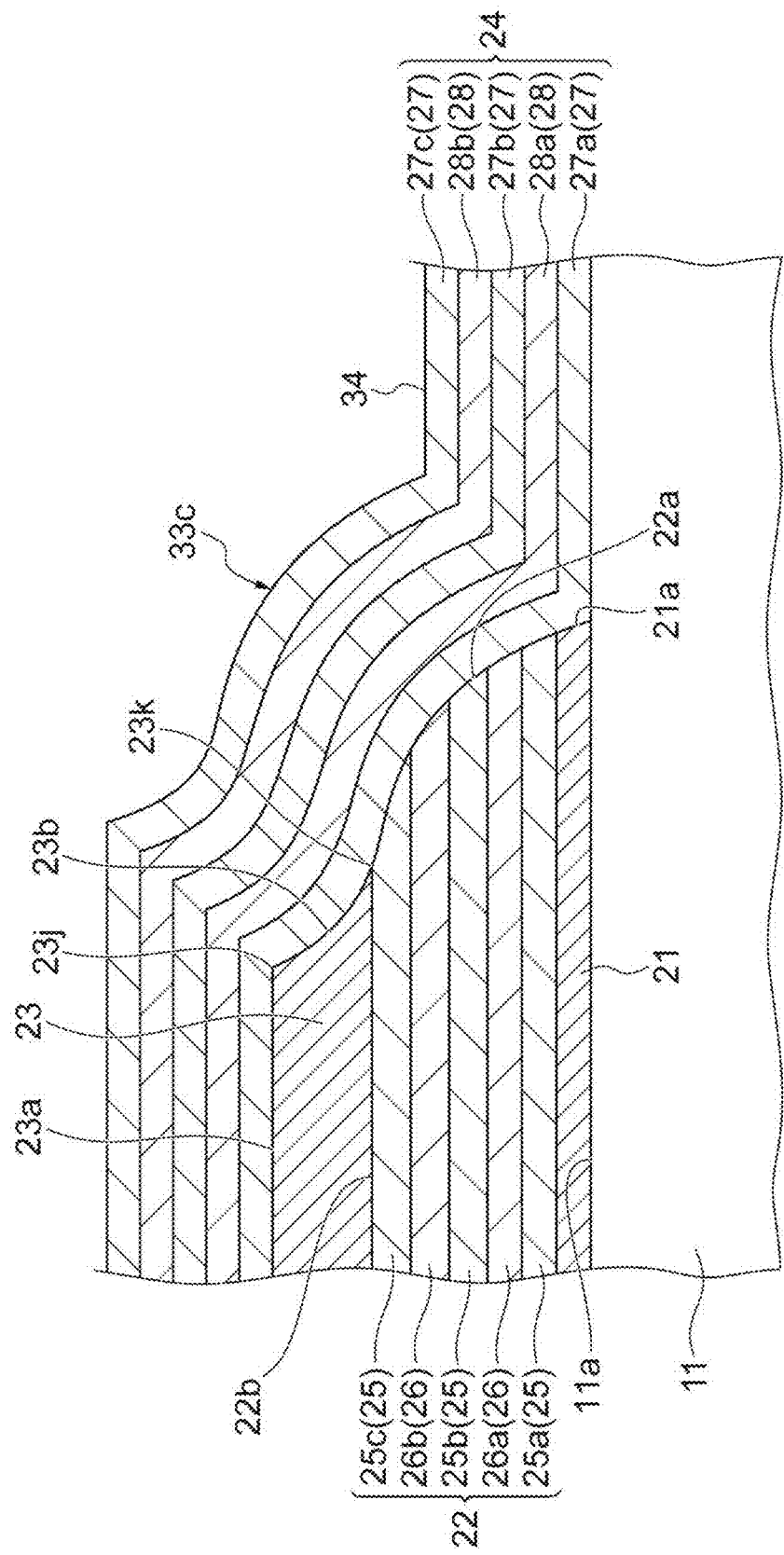
FIG. 6 is an enlarged cross-sectional view of an outer edge part of the Fabry-Perot interference filter in FIG. 1.

As illustrated in FIGS. 4 to 6, the intermediate layer 23 has a first inner surface 23d formed to surround the first terminals 15, a second inner surface 23e formed to surround the second terminals 16, and an outer surface 23b configuring the outer edge of the intermediate layer 23.

As illustrated in FIG. 4, the first inner surface 23d is curved such that an edge portion 23g of the intermediate layer 23 on the substrate 11 side is positioned on the first terminals 15 side of an edge portion 23f of the intermediate layer 23 on the side opposite to the substrate 11 in a direction parallel to the first surface 11a (that is, a continuously curved surface is formed). That is, in a case of being seen in the direction perpendicular to the first surface 11a, the edge portion 23f surrounds the edge portion 23g. More specifically, the first inner surface 23d is curved in a recessed shape on a side opposite to the first terminals 15 in a cross section perpendicular to the first surface 11a. An end portion of the first inner surface 23d on the first laminate 22 side is smoothly connected to the surface 22b of the first laminate 22. The first inner surface 23d illustrated in FIG. 4 is curved in a recessed shape on the side opposite to the first terminals 15 so as to be close to the first terminals 15 in the direction parallel to the first surface 11a while becoming close to the substrate 11 in the direction perpendicular to the first surface 11a. In other words, on the first inner surface 23d illustrated in FIG. 4, the angle of the first inner surface 23d with respect to the first surface 11a decreases while becoming close to the substrate 11 in the direction perpendicular to the first surface 11a.

As illustrated in FIG. 5, the second inner surface 23e is curved such that an edge portion 23i of the intermediate layer 23 on the substrate 11 side is positioned on the second terminals 16 side of an edge portion 23h of the intermediate layer 23 on the side opposite to the substrate 11 in the direction parallel to the first surface 11a (that is, a continuously curved surface is formed). That is, in a case of being seen in the direction perpendicular to the first surface 11a, the edge portion 23h surrounds the edge portion 23i. More specifically, the second inner surface 23e is curved in a recessed shape on a side opposite to the second terminals 16 in a cross section perpendicular to the first surface 11a. An end portion of the second inner surface 23e on the first laminate 22 side is smoothly connected to the surface 22b of the first laminate 22. The second inner surface 23e illustrated in FIG. 5 is curved in a recessed shape on the side opposite to the second terminals 16 so as to be close to the second terminals 16 in the direction parallel to the first surface 11a while becoming close to the substrate 11 in the direction perpendicular to the first surface 11a. In other words, in the second inner surface 23e illustrated in FIG. 5, the angle of the second inner surface 23e with respect to the first surface 11a decreases while becoming close to the substrate 11 in the direction perpendicular to the first surface 11a.

As illustrated in FIG. 6, the outer surface 23b is curved such that an edge portion 23k of the intermediate layer 23 on the substrate 11 side is positioned on the outer side of an edge portion 23j of the intermediate layer 23 on the side opposite to the substrate 11 in the direction parallel to the first surface 11a (that is, a continuously curved surface is formed). That is, in a case of being seen in the direction perpendicular to the first surface 11a, the edge portion 23k surrounds the edge portion 23j. More specifically, the outer surface 23b is curved in a recessed shape on the gap S side in a cross section perpendicular to the first surface 11a. An end portion of the outer surface 23b on the first laminate 22 side is smoothly connected to the surface 22b or an outer surface 22a of the first laminate 22. The outer surface 23b illustrated in FIG. 6 is curved in a recessed shape on the gap S side so as to be away from the gap S in the direction parallel to the first surface 11a while becoming close to the substrate 11 in the direction perpendicular to the first surface 11a. In other words, in the outer surface 23b illustrated in FIG. 6, the angle of the outer surface 23b with respect to the first surface 11a decreases while becoming close to the substrate 11 in the direction perpendicular to the first surface 11a.

The first laminate 22 has the outer surface 22a configuring the outer edge of the first laminate 22. The outer surface 22a of the first laminate 22 is positioned on the outer side in the direction parallel to the first surface 11a of the outer surface 23b of the intermediate layer 23 with respect to the center portion of the gap S. The outer surface 22a of the first laminate 22 is curved so as to be away from the gap S in the direction parallel to the first surface 11a while becoming close to the substrate 11 in the direction perpendicular to the first surface 11a (that is, a continuously curved surface is formed). More specifically, the outer surface 22a of the first laminate 22 is curved in a projected shape on the side opposite to the gap S in the direction parallel to the first surface 11a. In other words, on the outer surface 22a of the first laminate 22, the angle of the outer surface 22a of the first laminate 22 with respect to the first surface 11a increases while becoming close to the substrate 11 in the direction perpendicular to the first surface 11a.

As illustrated in FIG. 4, the second laminate 24 further has a first covering portion 33a and a first inner bottom portion 35a. The first covering portion 33a and the first inner bottom portion 35a have the same laminated structure as the second mirror portion 32 (refer to FIG. 3) and are integrally formed to be connected to each other. The first covering portion 33a covers the surface 23a of the intermediate layer 23 on the side opposite to the substrate 11, and the first inner surface 23d and leads to the first laminate 22. The first inner bottom portion 35a is formed on the first laminate 22 in a region surrounded by the first inner surface 23d in a case of being seen in the direction perpendicular to the first surface 11a.

As illustrated in FIG. 5, the second laminate 24 further has a second covering portion 33b and a second inner bottom portion 35b. The second covering portion 33b and the second inner bottom portion 35b have the same layer structure as a part of the laminated structure of the second mirror portion 32 (refer to FIG. 3) and are integrally formed to be connected to each other. The second covering portion 33b covers the surface 23a of the intermediate layer 23 on the side opposite to the substrate 11, and the second inner surface 23e and leads to the first laminate 22. The second inner bottom portion 35b is formed on the first laminate 22 in a region surrounded by the second inner surface 23e in a case of being seen in the direction perpendicular to the first surface 11a.

As illustrated in FIG. 6, the second laminate 24 further has a third covering portion 33c and a peripheral edge portion 34. The third covering portion 33c and the peripheral edge portion 34 have the same laminated structure as each other as the second mirror portion 32 (refer to FIG. 3) and are integrally formed to be connected to each other. The third covering portion 33c surrounds the second mirror portion 32 in a case of being seen in the direction perpendicular to the first surface 11a. The third covering portion 33c covers the surface 23a of the intermediate layer 23 on the side opposite to the substrate 11, the outer surface 23b of the intermediate layer 23, the outer surface 22a of the first laminate 22, and a side surface 21a of the reflection prevention layer 21 and leads to the first surface 11a. That is, the third covering portion 33c covers the outer edge of the intermediate layer 23, the outer edge of the first laminate 22, and the outer edge of the reflection prevention layer 21.

The peripheral edge portion 34 surrounds the third covering portion 33c in a case of being seen in the direction perpendicular to the first surface 11a. The peripheral edge portion 34 is positioned on the first surface 11a in the outer edge portion 11c. That is, the peripheral edge portion 34 covers the outer edge portion 11c. An outer edge of the peripheral edge portion 34 coincides with the outer edge of the substrate 11 in a case of being seen in the direction perpendicular to the first surface 11a.

The peripheral edge portion 34 is thinned along an outer edge of the outer edge portion 11c. That is, a part along the outer edge of the outer edge portion 11c in the peripheral edge portion 34 is thinned compared to other parts excluding the part along the outer edge in the peripheral edge portion 34. In the present embodiment, the peripheral edge portion 34 is thinned by removing a part of the polysilicon layers 27 and the silicon nitride layers 28 configuring the second laminate 24. The peripheral edge portion 34 has a non-thinned portion 34a connected to the third covering portion 33c, and a thinned portion 34b surrounding the non-thinned portion 34a. In the thinned portion 34b, the polysilicon layers 27 and the silicon nitride layers 28 are removed, excluding the polysilicon layer 27a directly provided on the first surface 11a.

The height of a surface 34c of the non-thinned portion 34a on the side opposite to the substrate 11 from the first surface 11a is lower than the height of the surface 23a of the intermediate layer 23 from the first surface 11a. The height of the surface 34c of the non-thinned portion 34a from the first surface 11a ranges from 100 nm to 5,000 nm, for example. The height of the surface 23a of the intermediate layer 23 from the first surface 11a ranges from 500 nm to 20,000 nm, for example, and is greater than the height of the surface 34c of the non-thinned portion 34a from the first surface 11a. The width of the thinned portion 34b (distance between an outer edge of the non-thinned portion 34a and the outer edge of the outer edge portion 11c) is equal to or greater than 0.01 times the thickness of the substrate 11. The width of the thinned portion 34b ranges from 5 µm to 400 µm, for example. The thickness of the substrate 11 ranges from 500 µm to 800 µm, for example.

A reflection prevention layer 41, a third laminate (third layer) 42, an intermediate layer (third layer) 43, and a fourth laminate (third layer) 44 are laminated on the second surface 11b of the substrate 11 in this order. The reflection prevention layer 41 and the intermediate layer 43 each have a configuration similar to those of the reflection prevention layer 21 and the intermediate layer 23. The third laminate 42 and the fourth laminate 44 each have a laminated structure symmetrical to those of the first laminate 22 and the second laminate 24 based on the substrate 11. The reflection prevention layer 41, the third laminate 42, the intermediate layer 43, and the fourth laminate 44 have a function of preventing a warpage of the substrate 11.

The third laminate 42, the intermediate layer 43, and the fourth laminate 44 are thinned along the outer edge of the outer edge portion 11c. That is, the part along the outer edge of the outer edge portion 11c in the third laminate 42, the intermediate layer 43, and the fourth laminate 44 is thinned compared to other parts excluding a part along an outer edge in the third laminate 42, the intermediate layer 43, and the fourth laminate 44. In the present embodiment, the third laminate 42, the intermediate layer 43, and the fourth laminate 44 are thinned by removing the entirety of the third laminate 42, the intermediate layer 43, and the fourth laminate 44 in a part overlapping the thinned portion 34b in a case of being seen in the direction perpendicular to the first surface 11a.

An opening 40a is provided in the third laminate 42, the intermediate layer 43, and the fourth laminate 44 such that the light transmission region 1a is included. The opening 40a has a diameter approximately the same as the size of the light transmission region 1a. The opening 40a is open on a light emission side, and a bottom surface of the opening 40a leads to the reflection prevention layer 41.

A light shielding layer 45 is formed on a surface of the fourth laminate 44 on the light emission side. For example, the light shielding layer 45 is made of aluminum. A protective layer 46 is formed on a surface of the light shielding layer 45 and an inner surface of the opening 40a. The protective layer 46 covers the outer edges of the third laminate 42, the intermediate layer 43, the fourth laminate 44, and the light shielding layer 45 and covers the reflection prevention layer 41 on the outer edge portion 11c. For example, the protective layer 46 is made of aluminum oxide. Optical influence due to the protective layer 46 can be disregarded by causing the thickness of the protective layer 46 to range from 1 to 100 nm (preferably, approximately 30 nm).

In the Fabry-Perot interference filter 1 configured as described above, if a voltage is applied to a location between the first electrode 12 and the third electrode 14 through the first terminals 15 and the second terminals 16, an electrostatic force corresponding to the voltage is generated between the first electrode 12 and the third electrode 14. The second mirror portion 32 is attracted to the first mirror portion 31 side fixed to the substrate 11 due to the electrostatic force, and the distance between the first mirror portion 31 and the second mirror portion 32 is adjusted. In this way, in the Fabry-Perot interference filter 1, the distance between the first mirror portion 31 and the second mirror portion 32 is changeable.

The wavelength of light transmitted through the Fabry-Perot interference filter 1 depends on the distance between the first mirror portion 31 and the second mirror portion 32 in the light transmission region 1*a*. Therefore, the wavelength of transmitting light can be suitably selected by adjusting the voltage to be applied to a location between the first electrode 12 and the third electrode 14. At this time, the second electrode 13 has the same potential as that of the third electrode 14. Therefore, the second electrode 13 functions as a compensation electrode to keep the first mirror portion 31 and the second mirror portion 32 flat in the light transmission region 1*a*.

In the Fabry-Perot interference filter 1, for example, a spectroscopic spectrum can be obtained by detecting light (output light) transmitted through the Fabry-Perot interference filter 1 using a light detector while the voltage to be applied to the Fabry-Perot interference filter 1 is changed (that is, while the distance between the first mirror portion 31 and the second mirror portion 32 is changed in the Fabry-Perot interference filter 1).

As described above, in the Fabry-Perot interference filter 1, the third covering portion 33*c* of the second laminate 24 covers the outer surface 23*b* of the intermediate layer 23. Consequently, noise can be prevented from being increased in light output from the Fabry-Perot interference filter 1 due to incident light from the outer surface 23*b* of the intermediate layer 23. Therefore, characteristics of the Fabry-Perot interference filter 1 can be prevented from deteriorating. Incidentally, in the Fabry-Perot interference filter 1, since the second laminate 24 covers the outer surface 23*b* of the intermediate layer 23, when the second mirror portion 32 moves to the first mirror portion 31 side, a force also acts toward the second mirror portion 32 side with respect to a region of the second laminate 24 covering the outer surface 23*b* of the intermediate layer 23. Therefore, stress is likely to be concentrated in a corner portion on the outer surface 23*b* of the intermediate layer 23 on the second laminate 24 side. Here, in the Fabry-Perot interference filter 1, the outer surface 23*b* of the intermediate layer 23 is curved such that the edge portion 23*k* of the intermediate layer 23 on the substrate 11 side is positioned on the outer side in the direction parallel to the first surface 11*a* of the edge portion 23*j* of the intermediate layer 23 on the side opposite to the substrate 11. Consequently, stress can be dispersed in the corner portion on the outer surface 23*b* of the intermediate layer 23 on the second laminate 24 side. Therefore, damage such as a crack can be prevented from being caused in the corner portion. As described above, according to the Fabry-Perot interference filter 1, high reliability can be achieved.

In addition, in the Fabry-Perot interference filter 1, compared to a case in which the outer surface 23*b* of the intermediate layer 23 is not curved, a contact area between the outer surface 23*b* of the intermediate layer 23 and the second laminate 24 is widened. Consequently, the second laminate 24 can be firmly fixed to the outer surface 23*b* of the intermediate layer 23. In addition, the outer surface 23*b* of the intermediate layer 23 is curved so as to be away from the gap S in the direction parallel to the first surface 11*a* while becoming close to the substrate 11 in the direction perpendicular to the first surface 11*a*. Consequently, in a manufacturing step, the thickness (coverage) of the third covering portion 33*c* of the second laminate 24 covering the outer surface 23*b* of the intermediate layer 23 can be favorably maintained.

In addition, in the Fabry-Perot interference filter 1, the outer surface 23*b* of the intermediate layer 23 is curved in a recessed shape on the gap S side such that the edge portion 23*k* of the intermediate layer 23 on the substrate 11 side is positioned on the outer side in the direction parallel to the first surface 11*a* of the edge portion 23*j* of the intermediate layer 23 on the side opposite to the substrate 11.

Consequently, the angle of the outer surface 23*b* of the intermediate layer 23 with respect to the first surface 11*a* decreases in a part close to the substrate 11 on the outer surface 23*b* of the intermediate layer 23 while becoming close to the substrate 11 in the direction perpendicular to the first surface 11*a*. Accordingly, the second laminate 24 can be prevented from peeling from a part close to the substrate 11 on the outer surface 23*b* of the intermediate layer 23.

In addition, in the Fabry-Perot interference filter 1, the outer surface 23*b* of the intermediate layer 23 is curved so as to be away from the gap S in the direction parallel to the first surface 11*a* while becoming close to the substrate 11 in the direction perpendicular to the first surface 11*a*. Consequently, the outer surface 23*b* of the intermediate layer 23 in its entirety is separated from the gap S in the direction parallel to the first surface 11*a* while becoming close to the substrate 11 in the direction perpendicular to the first surface 11*a*. Accordingly, stress can be further dispersed in the corner portion on the outer surface 23*b* of the intermediate layer 23 on the second laminate 24 side.

In addition, in the Fabry-Perot interference filter 1, the outer surface 22*a* of the first laminate 22 is positioned on the outer side in the direction parallel to the first surface 11*a* of the outer surface 23*b* of the intermediate layer 23 with respect to the center portion of the gap 5, and the third covering portion 33*c* of the second laminate 24 covers the outer surface 22*a* of the first laminate 22. Consequently, the third covering portion 33*c* of the second laminate 24 covers a range to the outer surface 22*a* of the first laminate 22 beyond the outer surface 23*b* of the intermediate layer 23 and is fixed to the outer surface 22*a* of the first laminate 22. Thus, the second laminate 24 can be prevented from peeling from a part close to the substrate 11 on the outer surface 23*b* of the intermediate layer 23.

In addition, in the Fabry-Perot interference filter 1, in a case of being seen in the direction perpendicular to the first surface 11*a*, the substrate 11 has the outer edge portion 11*c* positioned on the outer side of the outer edge of the first laminate 22, and the second laminate 24 covers the outer edge portion 11*c*. Consequently, the second laminate 24 covers a range to the outer edge portion 11*c* of the substrate 11 beyond the outer edge of the first laminate 22, so that the first laminate 22 is fixed to the substrate 11 side. Thus, the first laminate 22 can be prevented from peeling from the substrate 11 side.

In addition, in the Fabry-Perot interference filter 1, the outer surface 22*a* of the first laminate 22 is curved so as to be away from the gap S in the direction parallel to the first surface 11*a* while becoming close to the substrate 11 in the direction perpendicular to the first surface 11*a*. Consequently, the third covering portion 33*c* of the second laminate 24 is more firmly fixed to the outer surface 22*a* of the first laminate 22. Thus, the second laminate 24 can be prevented from peeling from a part close to the substrate 11 on the outer surface 23*b* of the intermediate layer 23.

In addition, the Fabry-Perot interference filter 1 further includes the third laminate 42 that is disposed on the second surface 11*b* opposite to the first surface 11*a* in the substrate 11. Consequently, it is possible to reduce stress caused by discordance of the layer configuration between the first surface 11*a* side and the second surface 11*b* side of the substrate 11. Therefore, concentration of stress in the intermediate layer 23 can be further prevented.

Figure 7:
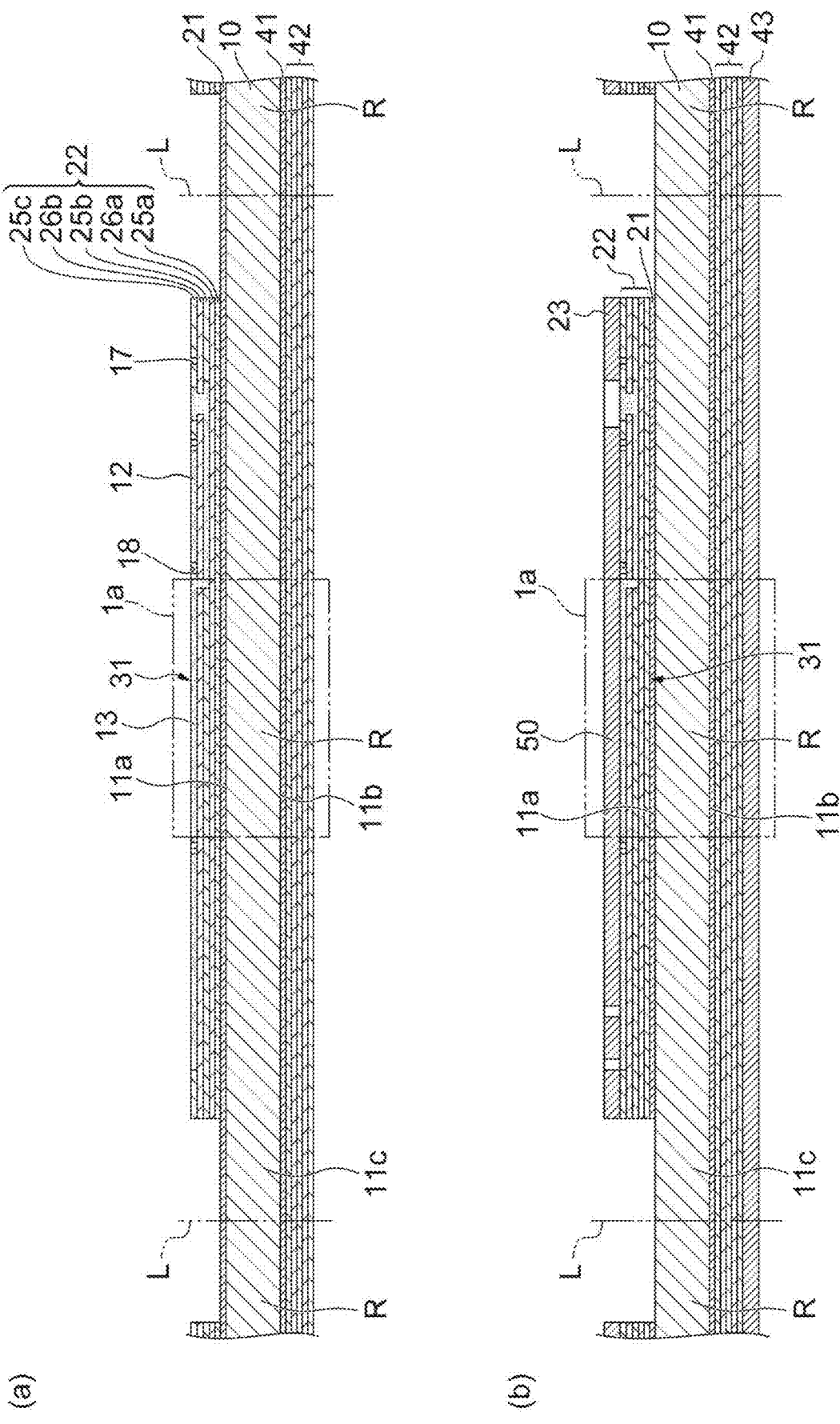
FIG. 7 is a view for describing a method of manufacturing the Fabry-Perot interference filter in FIG. 1.
Figure 8:
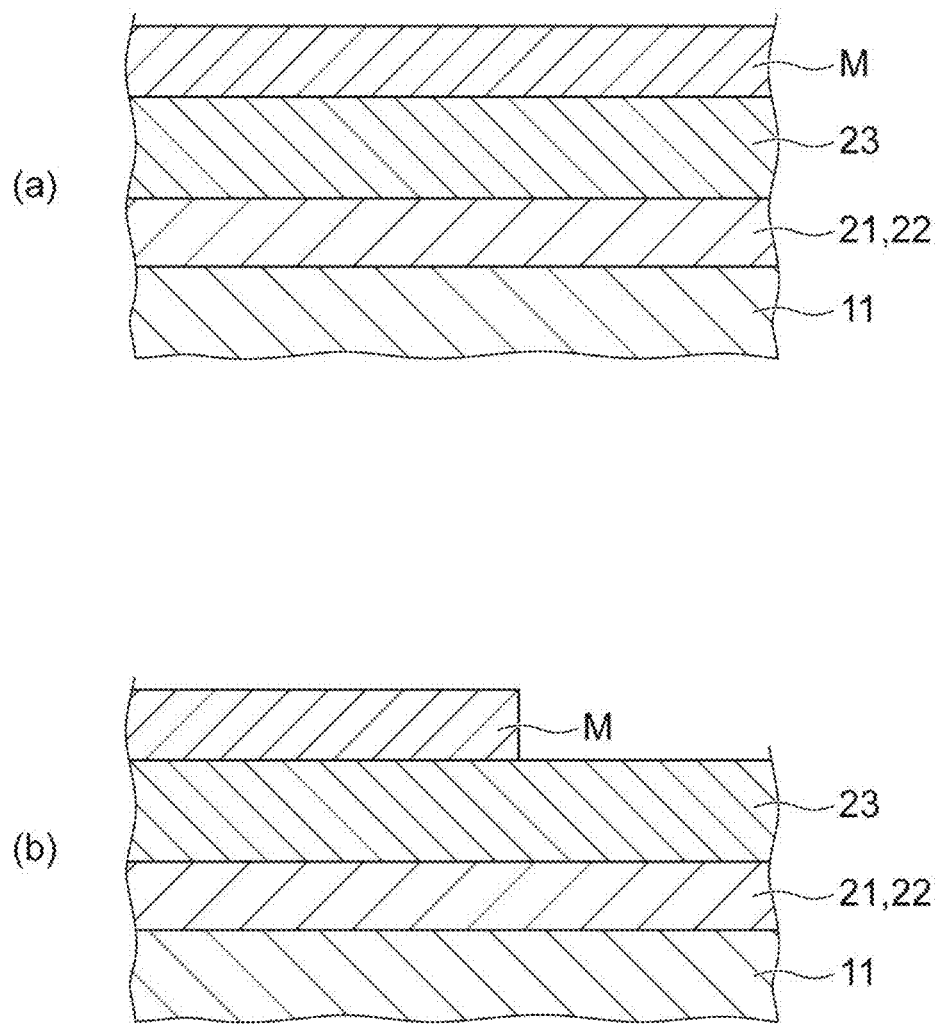
FIG. 8 is a view for describing the method of manufacturing the Fabry-Perot interference filter in FIG. 1.
Figure 9:
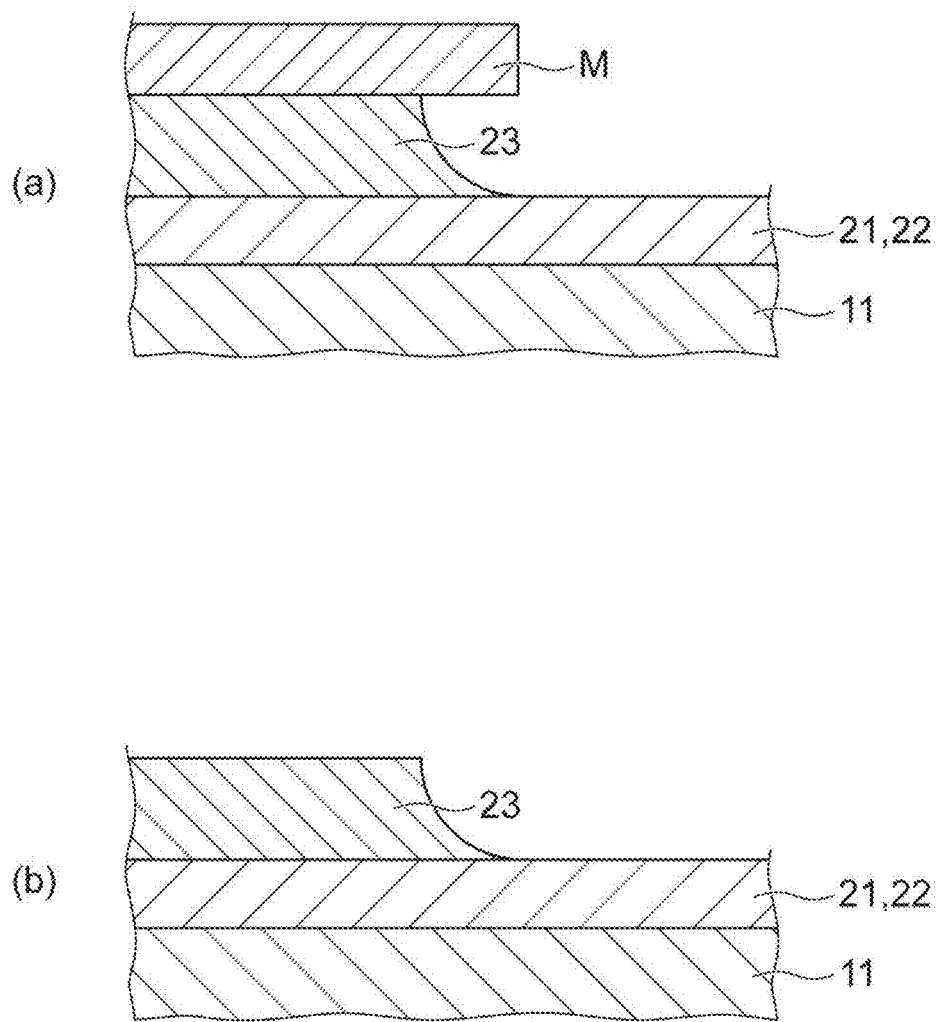
FIG. 9 is a view for describing the method of manufacturing the Fabry-Perot interference filter in FIG. 1.
Figure 10:
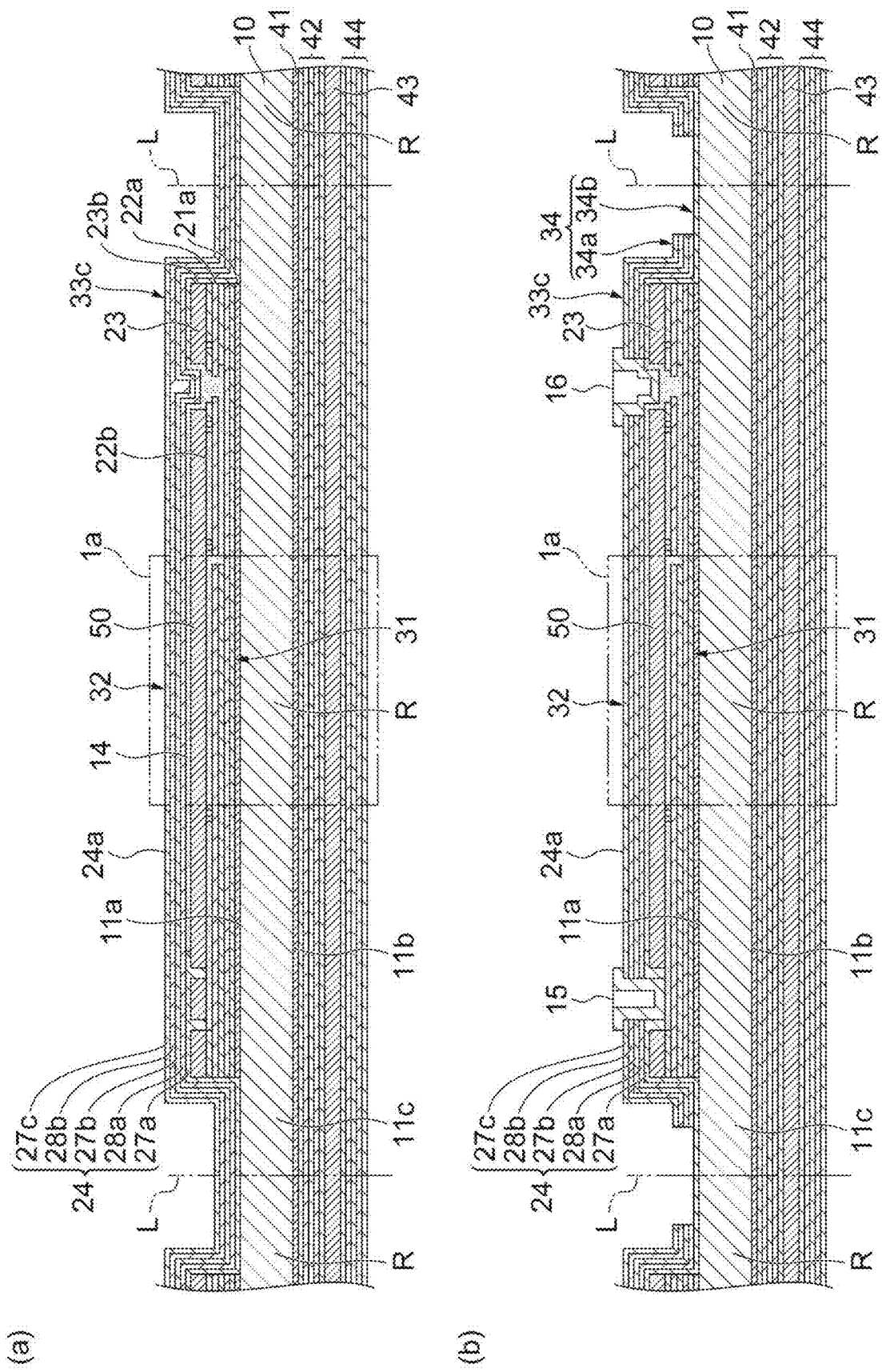
FIG. 10 is a view for describing the method of manufacturing the Fabry-Perot interference filter in FIG. 1.
Figure 11:
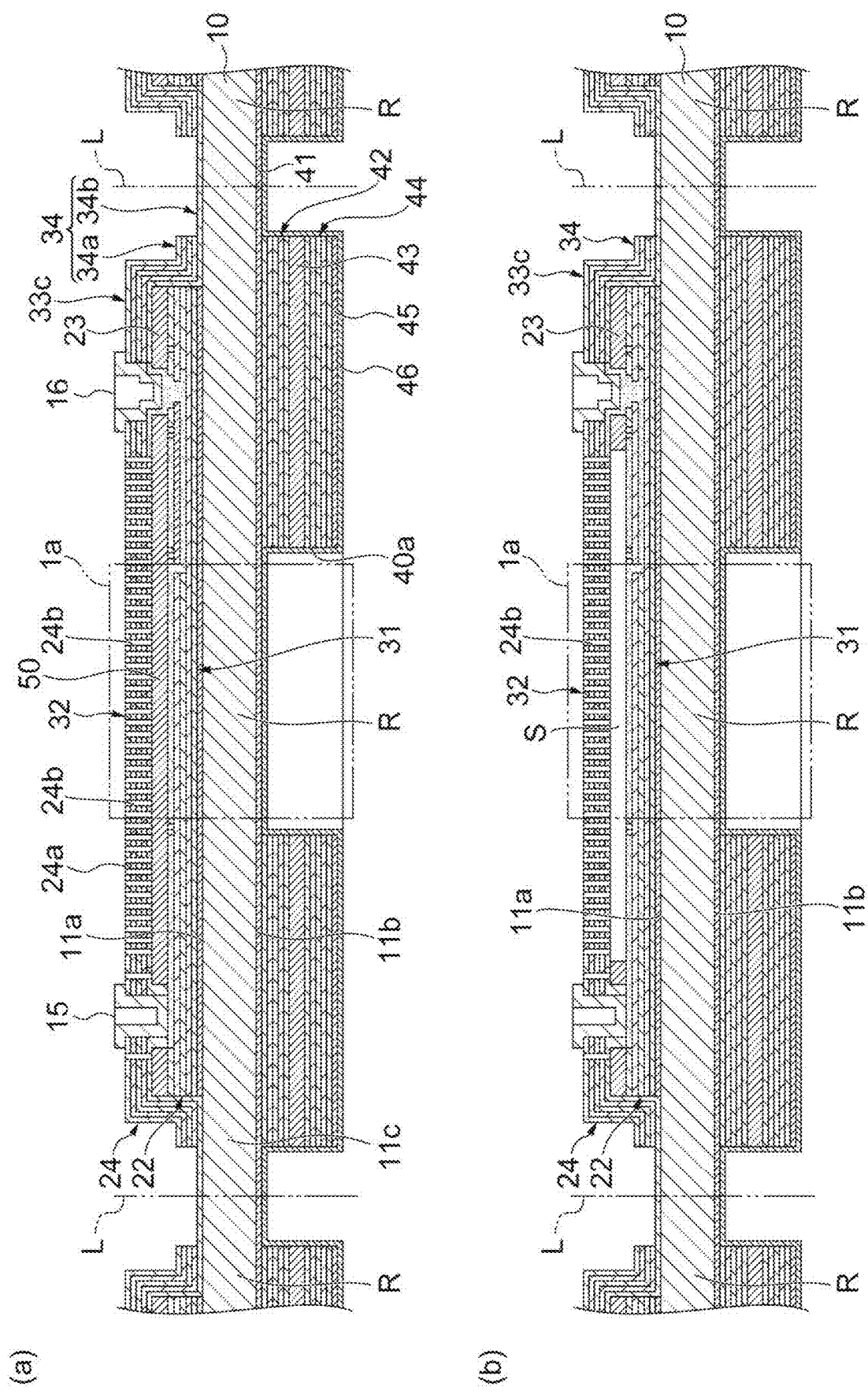
FIG. 11 is a view for describing the method of manufacturing the Fabry-Perot interference filter in FIG. 1.

Next, with reference to FIGS. 7 to 12, an example of a method of manufacturing the Fabry-Perot interference filter 1 will be described. However, in FIGS. 7 and 10 to 12, the outer surface 22a of the first laminate 22, the outer surface 23b of the intermediate layer 23, and the third covering portion 33c of the second laminate 24 are simply illustrated. First, as illustrated in FIG. 7(a), a wafer 10 including a plurality of parts R corresponding to the substrate 11 is prepared, and the first laminate 22 having the first mirror portion 31 is formed for each of the parts R corresponding to the substrate 11 in the wafer 10 (first step). For example, the wafer 10 is a silicon wafer. In the wafer 10, for example, the parts R are disposed to be adjacent to each other in a lattice state. A dicing line L is set on the border between the parts R.

In the first step, first, the reflection prevention layer 21 is formed on the first surface 11a of the part R. At the same time, the reflection prevention layer 41 is formed on the second surface 11b of the part R. Subsequently, the polysilicon layer 25a, the silicon nitride layer 26a, the polysilicon layer 25b, the silicon nitride layer 26b, and the polysilicon layer 25c configuring the first laminate 22 are laminated on the reflection prevention layer 21 in this order. At the same time as the first laminate 22 is laminated, a polysilicon layer and a silicon nitride layer configuring the third laminate 42 are laminated on the reflection prevention layer 41. When the first laminate 22 is laminated, the polysilicon layer 25 and the silicon nitride layer 26 are laminated over the first surface 11a. Thereafter, a part of the polysilicon layer 25 and the silicon nitride layer 26 positioned on the outer edge portion lie in a case of being seen in the direction perpendicular to the first surface 11a is removed through etching. In addition, in parallel with laminating of the first laminate 22, the polysilicon layers 25b and 25c are partially decreased in resistance by doping impurities, so that the first electrode 12 and the second electrode 13 are formed. Subsequently, the trench 18 is formed through etching.

Subsequently, as illustrated in FIG. 7(b), the intermediate layer 23 having a portion 50 expected to be removed corresponding to the gap S is formed for each of the parts R (second step). In the second step, first, the intermediate layer 23 is formed over the first surface 11a of the part R such that the first laminate 22 is covered with the intermediate layer 23. At the same time as the intermediate layer 23 is formed, the intermediate layer 43 is formed on the third laminate 42. Subsequently, a part of the intermediate layer 23 positioned on the outer edge portion 11c in a case of being seen in the direction perpendicular to the first surface 11a is removed through etching. During this etching, a part of the reflection prevention layer 21 positioned on the outer edge portion 11c in a case of being seen in the direction perpendicular to the first surface 11a is removed. In addition, during this etching, gaps are formed in parts corresponding to the first terminals 15, the first covering portion 33a, and the first inner bottom portion 35a in FIG. 4; and the second terminals 16, the second covering portion 33b, and the second inner bottom portion 35b in FIG. 5.

Moreover, during this etching, the first inner surface 23d, the second inner surface 23e, and the outer surface 23b are formed to have a curved shape. More specifically, the first inner surface 23d is formed to be curved in a recessed shape on the side opposite to the first terminals 15 so as to be close to the first terminals 15 in the direction parallel to the first surface 11a while becoming close to the substrate 11 in the direction perpendicular to the first surface 11a. In addition, the second inner surface 23e is formed to be curved in a recessed shape on the side opposite to the second terminals 16 so as to be close to the second terminals 16 in the direction parallel to the first surface 11a while becoming close to the substrate 11 in the direction perpendicular to the first surface 11a. In addition, the outer surface 23b is formed to be curved in a recessed shape on the gap S side so as to be away from the gap S in the direction parallel to the first surface 11a while becoming close to the substrate 11 in the direction perpendicular to the first surface 11a.

An example of a manufacturing method, in which the first inner surface 23d, the second inner surface 23e, and the outer surface 23b are formed to be curved in a recessed shape as described above, will be described. First, as illustrated in FIG. 8(a), a resist M is applied over the intermediate layer 23. Next, as illustrated in FIG. 8(b), through resist patterning, the resist M is removed from a region corresponding to a region of the intermediate layer 23 to be removed. Next, as illustrated in FIG. 9(a), the intermediate layer 23 is removed through etching (wet etching). At this time, a range to a part of the intermediate layer 23 covered with the resist M is removed, so that the intermediate layer 23 is formed to be curved in a recessed shape. The reflection prevention layer 21 and the first laminate 22 are formed in stages while repeating film-forming and etching, and etching of the intermediate layer 23 is carried out such that the outer surface 23b of the intermediate layer 23 is continuously (smoothly) connected to the outer surface 22a of the first laminate 22. Accordingly, as illustrated in FIG. 6, the outer surface 23b of the intermediate layer 23, the outer surface 22a of the first laminate 22, and the side surface 21a of the reflection prevention layer 21 have a continuously curved shape. Next, as illustrated in FIG. 9(b), the resist M remaining on the intermediate layer 23 is stripped off, so that the first inner surface 23d, the second inner surface 23e, and the outer surface 23b having the shape described above can be obtained.

Subsequently, as illustrated in FIGS. 10(a), 10(b), and 11(a), the second laminate 24 having the second mirror portion 32 in which the plurality of through-holes 24b are formed, the first covering portion 33a which covers the intermediate layer 23, the second covering portion 33b, the third covering portion 33c, the peripheral edge portion 34 thinned along the outer edge of the outer edge portion 11c, the first inner bottom portion 35a, and the second inner bottom portion 35b are formed for each of the parts R (third step).

In the third step, first, the polysilicon layer 27a, the silicon nitride layer 28a, the polysilicon layer 27b, the silicon nitride layer 28b, and the polysilicon layer 27c configuring the second laminate 24 are laminated on the intermediate layer 23 in this order. More specifically, as illustrated in FIG. 10(a), the second laminate 24 is laminated over the first surface 11a of the part R such that the second laminate 24 covers the surface 23a, the outer surface 23b, the first inner surface 23d, and the second inner surface 23e of the intermediate layer 23; the outer surface 22a of the first laminate 22; and the side surface 21a of the reflection prevention layer 21. On the other hand, at the same time as the second laminate 24 is laminated, the polysilicon layer and the silicon nitride layer configuring the fourth laminate 44 are laminated on the intermediate layer 43. Subsequently, as illustrated in FIG. 10(b), a part of the polysilicon layers 27 and the silicon nitride layers 28 corresponding to the thinned portion 34b is removed through etching, excluding the polysilicon layer 27a, so that the peripheral edge portion 34 thinned along the outer edge of the outer edge portion 11c is formed. In addition, in parallel with laminating of the second laminate 24, the polysilicon layer 27a is partially decreased in resistance by doping impurities, and the third electrode 14 is formed. Subsequently, the first terminals 15 and the second terminals 16 are formed.

Subsequently, as illustrated in FIG. 11(a), the second laminate 24 is partially etched, so that the through-holes 24b leading from the surface 24a of the second mirror portion 32 to the portion 50 expected to be removed are formed. Subsequently, the light shielding layer 45 is formed on the fourth laminate 44. Subsequently, a part of the third laminate 42, the intermediate layer 43, the fourth laminate 44, and the light shielding layer 45 overlapping the thinned portion 34b in a case of being seen in a perpendicular direction is removed through etching, so that the third laminate 42, the intermediate layer 43, and the fourth laminate 44 are thinned along the outer edge of the outer edge portion 11c. In addition, during this etching, the opening 40a is formed in the third laminate 42, the intermediate layer 43, the fourth laminate 44, and the light shielding layer 45. Subsequently, the protective layer 46 is formed on the surface of the light shielding layer 45 and the inner surface of the opening 40a.

Subsequently, as illustrated in FIG. 11(b), the portion 50 expected to be removed is removed through etching via the through-holes 24b, so that the gap S positioned between the first mirror portion 31 and the second mirror portion 32 is formed for each of the parts R (fourth step). In the fourth step, the portion 50 expected to be removed is removed through gas phase etching via the through-holes 24b. In this gas phase etching, for example, hydrofluoric acid gas is used.

Figure 12:
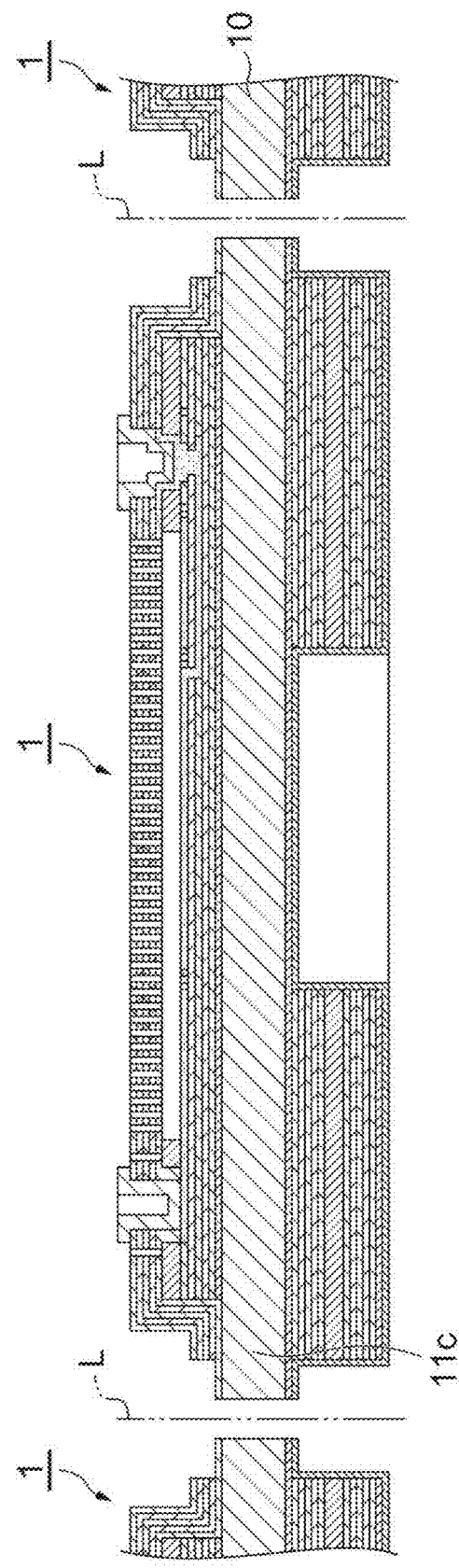
FIG. 12 is a view for describing the method of manufacturing the Fabry-Perot interference filter in FIG. 1.

Subsequently, as illustrated in FIG. 12, the wafer 10 is cut along the outer edge of the outer edge portion 11c in the dicing line L, and then the Fabry-Perot interference filter 1 is obtained (fifth step). In the fifth step, for example, the wafer 10 is cut along the outer edge of the outer edge portion 11c by forming a modified region within the wafer 10 along the outer edge of the outer edge portion 11c through irradiation of laser light from the first surface 11a side, and extending a crack from the modified region in the thickness direction of the wafer 10.

Hereinabove, an embodiment of the present invention has been described. However, the present invention is not limited to the embodiment described above. For example, the material and the shape of each of the configurations are not limited to the materials and the shapes described above, and various materials and shapes can be employed.

In addition, the reflection prevention layer 21 may be formed in a region on the outer side of the outer edge of the first laminate 22. For example, the reflection prevention layer 21 may also be formed without being removed in a part of the second laminate 24 corresponding to the peripheral edge portion 34 (that is, a part positioned on the outer edge portion 11c). In such a case, the outer edge of the reflection prevention layer 21 and the outer edge of the substrate 11 may coincide with each other.

In addition, the substrate 11 does not have to have the outer edge portion 11c. For example, in a case of being seen in the direction perpendicular to the first surface 11a, the outer surface 22a of the first laminate 22 may coincide with the outer edge of the substrate 11. In addition, in a case of being seen in the direction perpendicular to the first surface 11a, the side surface 21a of the reflection prevention layer 21 may coincide with the outer edge of the substrate 11.

In addition, the peripheral edge portion 34 does not have to have the thinned portion 34b. That is, the peripheral edge portion 34 may be formed to have a uniform thickness throughout the peripheral edge portion 34 in its entirety.

In addition, the second laminate 24 does not have to have the peripheral edge portion 34. That is, the second laminate 24 does not have to be positioned on the first surface 11a.

In addition, the first electrode 12 does not have to be formed as a part of the first mirror portion 31. The first electrode 12 does not have to be formed by doping impurities into the polysilicon layer 25c and decreasing resistance. For example, the first electrode 12 may be formed in a region other than the first mirror portion 31 in the first laminate 22. In this case, the first electrode 12 may be formed of metal such as aluminum.

In addition, the second electrode 13 does not have to be formed as a part of the first mirror portion 31. The second electrode 13 does not have to be formed by doping impurities into the polysilicon layer 25c and decreasing resistance. For example, the second electrode 13 may be formed in a region other than the first mirror portion 31 in the first laminate 22. In this case, the second electrode 13 may be formed of metal such as aluminum.

In addition, the third electrode 14 does not have to be formed as a part of the second mirror portion 32. The third electrode 14 does not have to be formed by doping impurities into the polysilicon layer 27a and decreasing resistance. For example, the third electrode 14 may be formed in a region other than the second mirror portion 32 in the second laminate 24. In this case, the third electrode 14 may be formed of metal such as aluminum.

In addition, the second inner surface 23e does not have to be curved such that the edge portion 23i of the intermediate layer 23 on the substrate 11 side is positioned on the second terminals 16 side in the direction parallel to the first surface 11a of the edge portion 23h of the intermediate layer 23 on the side opposite to the substrate 11.

In addition, the first inner surface 23d, the second inner surface 23e, or the outer surface 23b does not have to curved in a recessed shape. In addition, the second laminate 24 does not have to have the first inner bottom portion 35a or the second inner bottom portion 35b and does not have to cover the first inner surface 23d or the second inner surface 23e.

Figure 13:
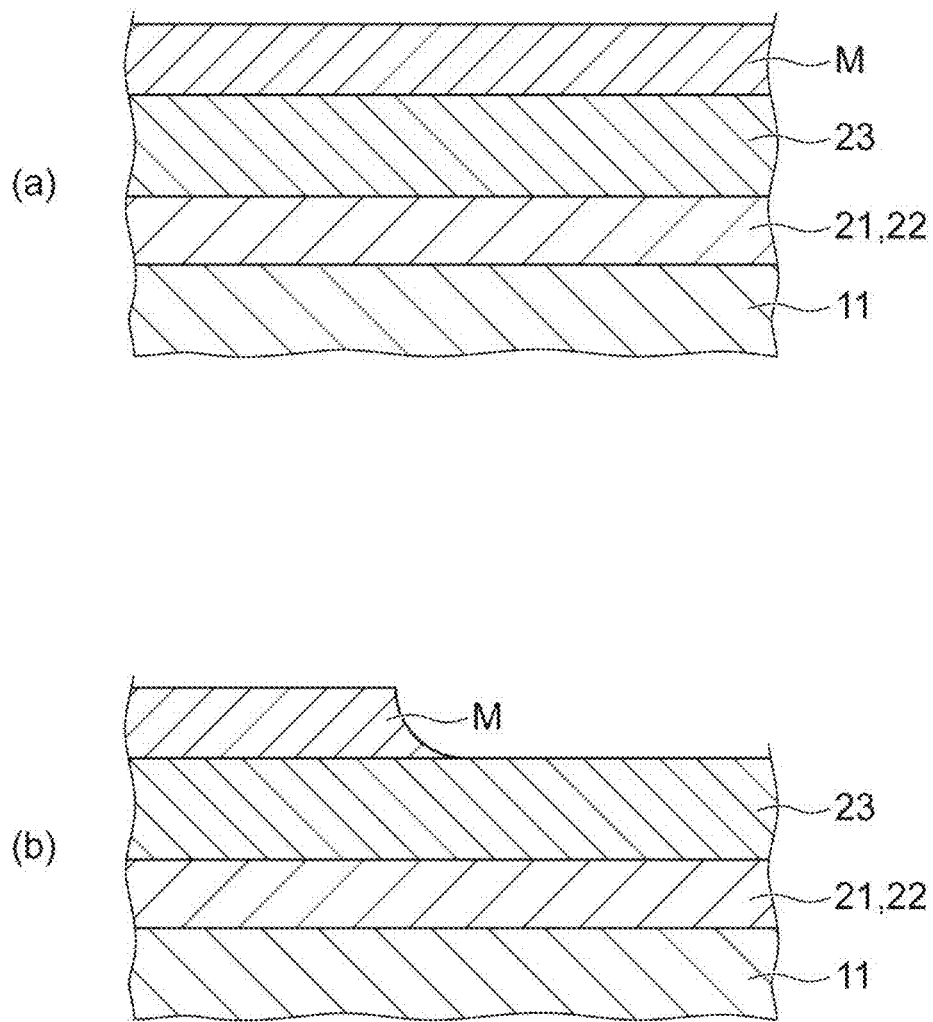
FIG. 13 is a view for describing a method of manufacturing a Fabry-Perot interference filter according to a modification example.
Figure 14:
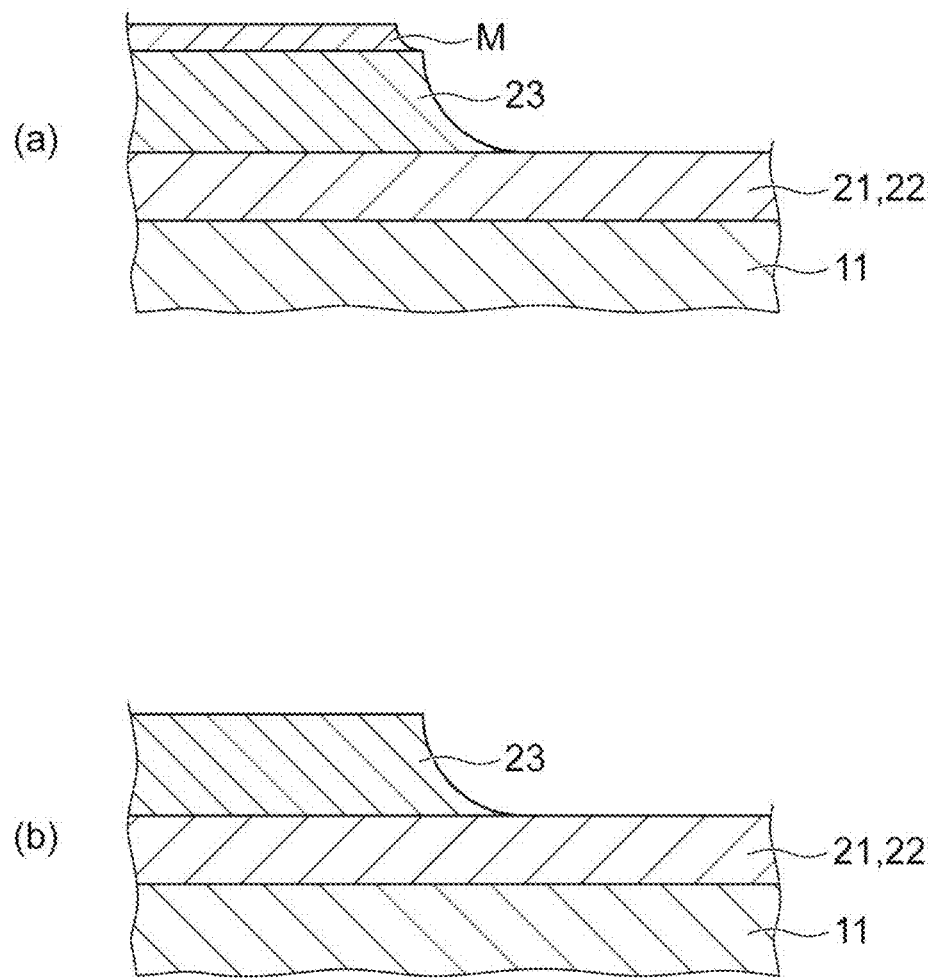
FIG. 14 is a view for describing the method of manufacturing the Fabry-Perot interference filter according to the modification example.

In addition, the manufacturing method, in which the first inner surface 23d, the second inner surface 23e, and the outer surface 23b are formed to be curved in a recessed shape in the second step, is not limited to that described above, and the following manufacturing method may be employed. First, as illustrated in FIG. 13(a), the resist M is applied over the intermediate layer 23. Next, as illustrated in FIG. 13(b), the resist M is subjected to exposure and development by using a 3D mask. Accordingly, the resist M is removed from a region corresponding to a region of the intermediate layer 23 to be removed, and a side surface of the resist M is formed to be curved in a recessed shape. Next, as illustrated in FIG. 14(a), the intermediate layer 23 is removed though dry etching. Accordingly, the curved recess shape of the side surface of the resist M is copied onto the first inner surface 23d, the second inner surface 23e, and the outer surface 23b, which are thereby forming to be curved in a recessed shape. Next, as illustrated in FIG. 14(b), the resist M remaining on the intermediate layer 23 is stripped off, so that the first inner surface 23d, the second inner surface 23e, and the outer surface 23b having the shape described above can be obtained.

Figure 15:
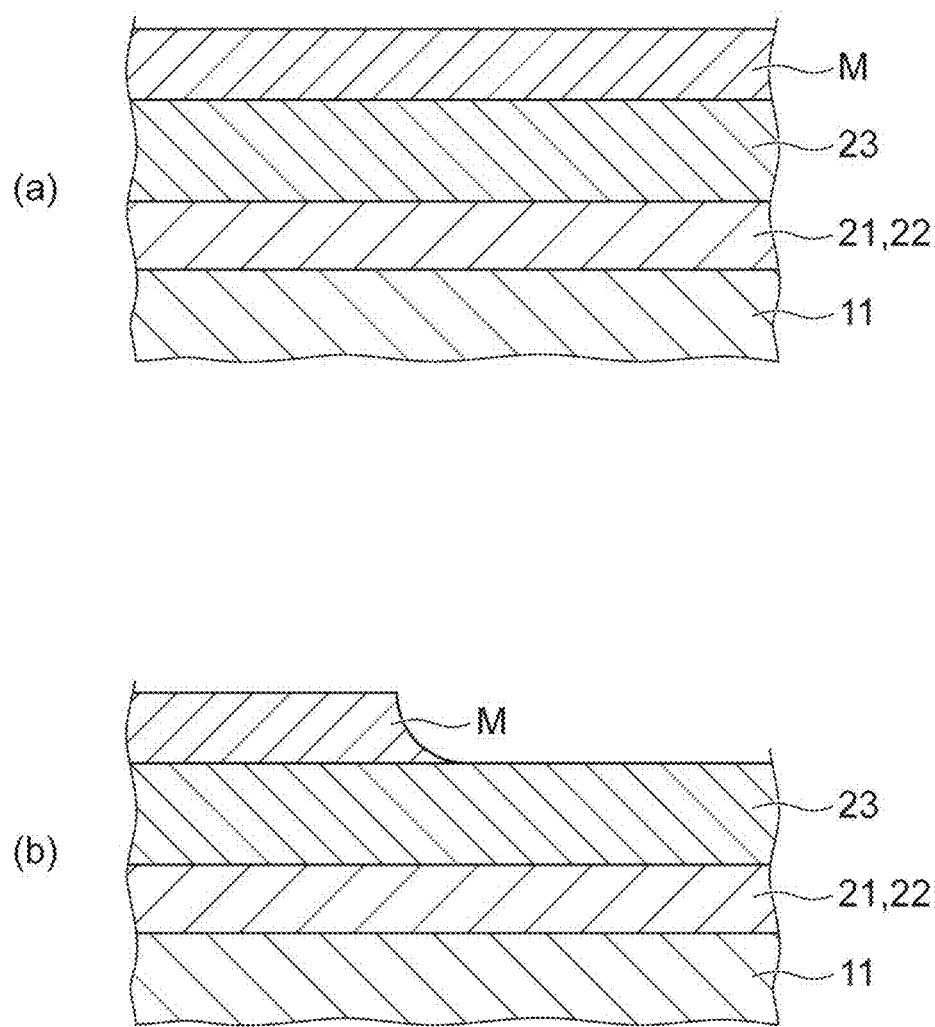
FIG. 15 is a view for describing the method of manufacturing the Fabry-Perot interference filter according to the modification example.
Figure 16:
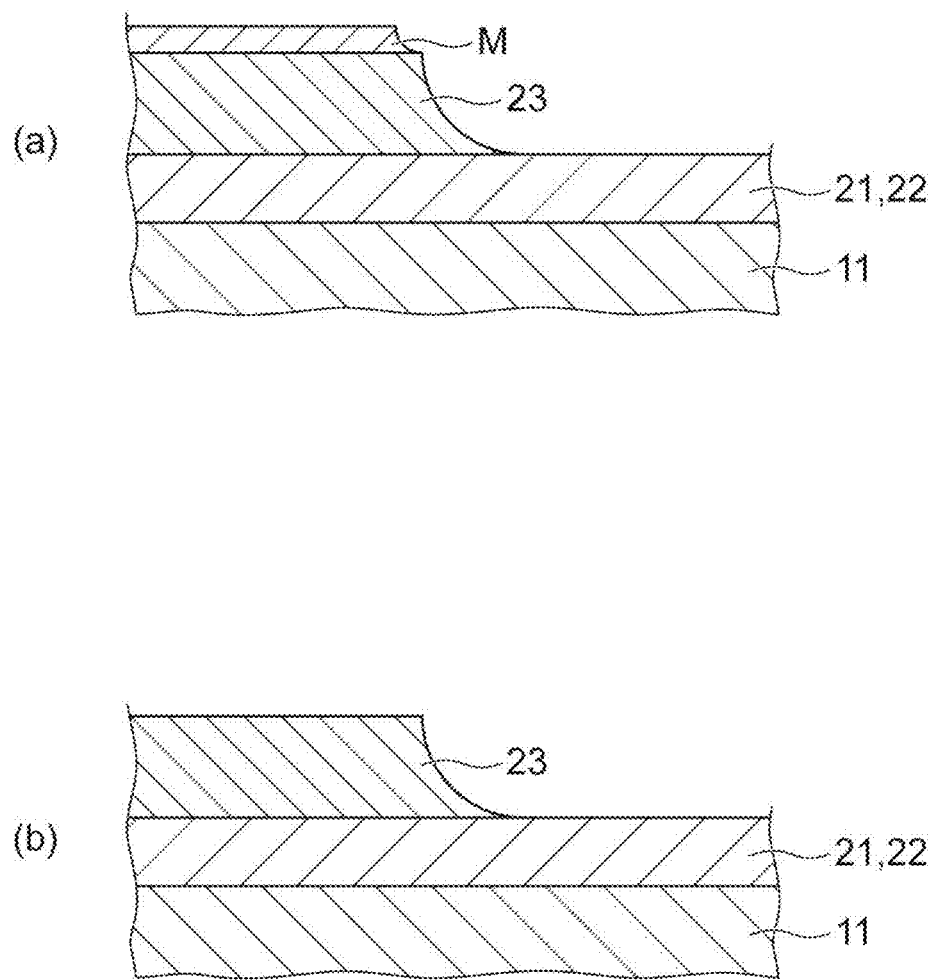
FIG. 16 is a view for describing the method of manufacturing the Fabry-Perot interference filter according to the modification example.

Alternatively, as a manufacturing method, in which the first inner surface 23d, the second inner surface 23e, and the outer surface 23b are formed to be curved in a recessed shape in the second step, the following manufacturing method may be employed. First, as illustrated in FIG. 15(a), the resist M is applied over the intermediate layer 23. Next, as illustrated in FIG. 15(b), the resist M is subjected to photolithography to remove the resist M in a region corresponding to a region of the intermediate layer 23 to be removed, and the side surface of the resist M is formed to be curved in a recessed shape. In the step of performing this photolithography, the side surface of the resist M can be formed to be curved in a recessed shape by adjusting conditions for the resist M (for example, the material) and conditions for photolithography (for example, exposure conditions, development conditions, and baking conditions). Next, as illustrated in FIG. 16(a), the intermediate layer 23 is removed through dry etching. Accordingly, the curved recess shape of the side surface of the resist M is copied onto the first inner surface 23d, the second inner surface 23e, and the outer surface 23b, which are thereby formed to be curved in a recessed shape. Next, as illustrated in FIG. 16(b), the resist M remaining on the intermediate layer 23 is stripped off, so that the first inner surface 23d, the second inner surface 23e, and the outer surface 23b having the shape described above can be obtained.

In addition, the first inner surface 23d may be curved in a projected shape on the first terminals 15 side. In other words, on the first inner surface 23d, the angle of the first inner surface 23d with respect to the first surface 11a may increase while becoming close to the substrate 11 in the direction perpendicular to the first surface 11a. In this case, in a corner portion on the first inner surface 23d on the side opposite to the first laminate 22, the outer shape of a cross section thereof has an obtuse angle shape. Thus, stress acting on the corner portion on the first inner surface 23d on the side opposite to the first laminate 22 is further dispersed, so that damage such as a crack can be further prevented from being caused in the corner portion.

In addition, the second inner surface 23e may be curved in a projected shape on the second terminals 16 side. In other words, on the second inner surface 23e, the angle of the second inner surface 23e with respect to the first surface 11a may increase while becoming close to the substrate 11 in the direction perpendicular to the first surface 11a. In this case, in a corner portion on the second inner surface 23e on the side opposite to the first laminate 22, the outer shape of a cross section thereof has an obtuse angle shape. Thus, stress acting on the corner portion on the second inner surface 23e on the side opposite to the first laminate 22 is further dispersed, so that damage such as a crack can be further prevented from being caused in the corner portion.

In addition, the outer surface 23b may be curved in a projected shape on the side opposite to the gap S. In other words, on the outer surface 23b, the angle of the outer surface 23b with respect to the first surface 11a may increase while becoming close to the substrate 11 in the direction perpendicular to the first surface 11a. In this case, in a corner portion on the outer surface 23b on the side opposite to the first laminate 22, the outer shape of a cross section thereof has an obtuse angle shape. Thus, stress acting on the corner portion on the outer surface 23b on the side opposite to the first laminate 22 is further dispersed, so that damage such as a crack can be further prevented from being caused in the corner portion.

Figure 17:
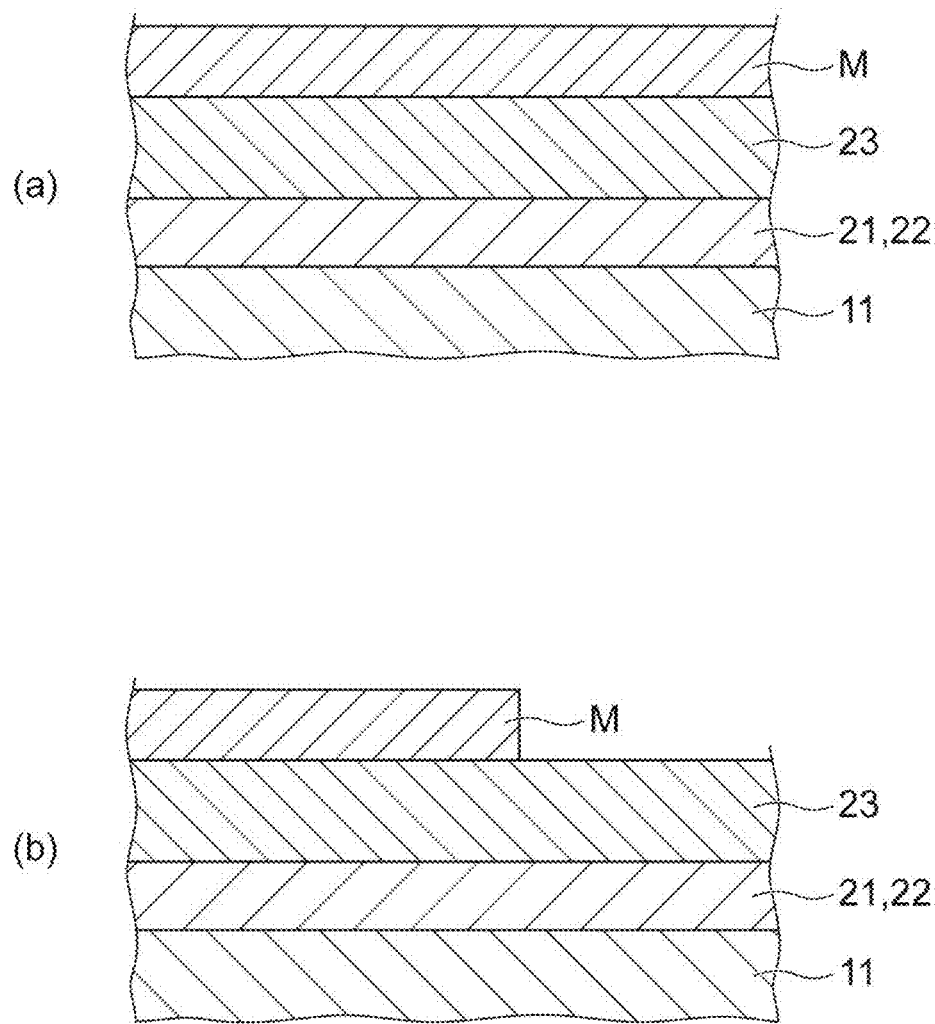
FIG. 17 is a view for describing the method of manufacturing the Fabry-Perot interference filter according to the modification example.
Figure 18:
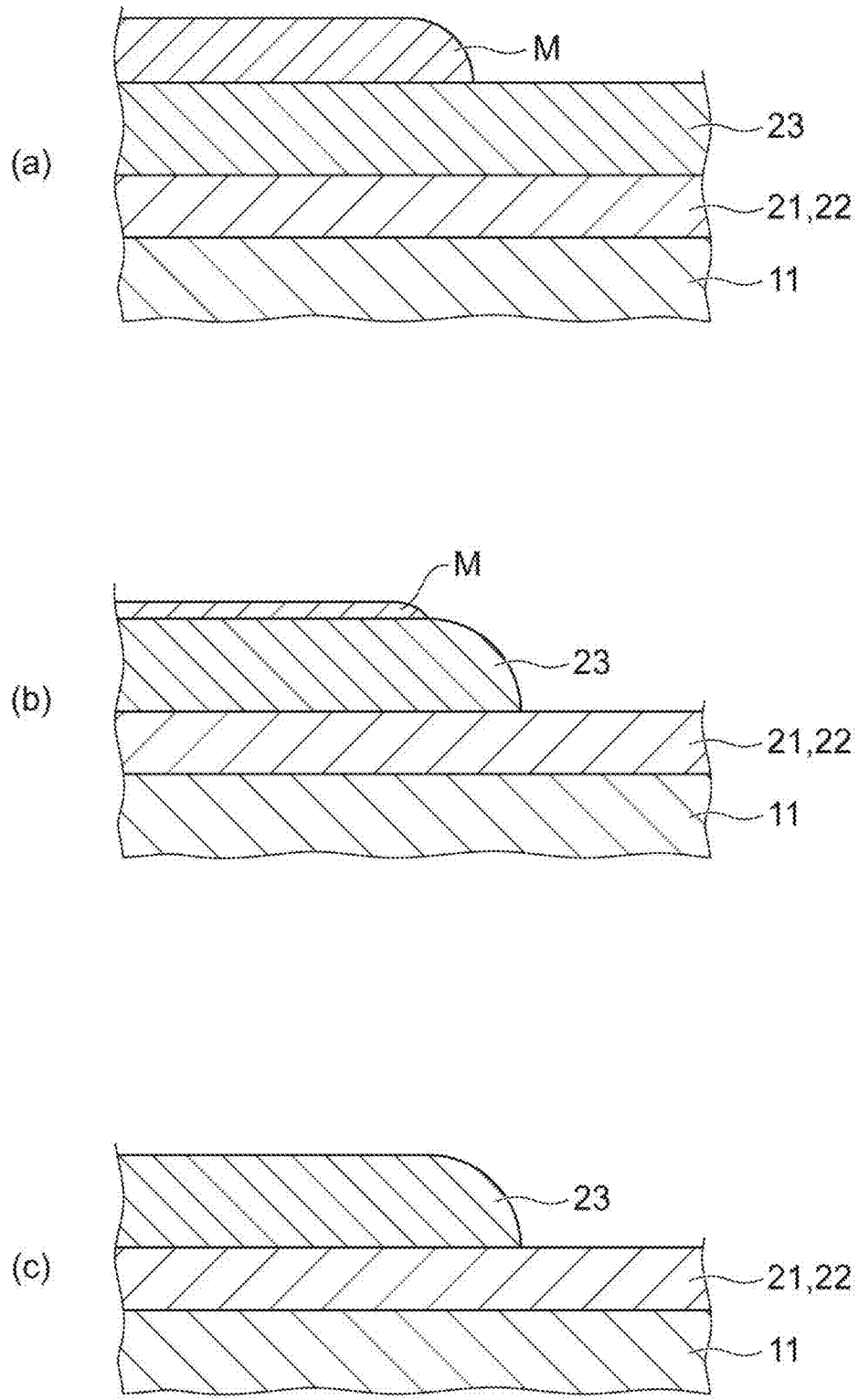
FIG. 18 is a view for describing the method of manufacturing the Fabry-Perot interference filter according to the modification example.

An example of a manufacturing method, in which the first inner surface 23d, the second inner surface 23e, and the outer surface 23b are formed to be curved in a projected shape as described above in the second step of this case, will be described. First, as illustrated in FIG. 17(a), the resist M is applied over the intermediate layer 23. Next, as illustrated in FIG. 17(b), through resist patterning, the resist M is removed from a region corresponding to a region of the intermediate layer 23 to be removed. Next, as illustrated in FIG. 18(a), the resist M is cured. Accordingly, the side surface of the resist M is formed to be curved in a projected shape. Next, as illustrated in FIG. 18(b), the intermediate layer 23 is removed through dry etching. Accordingly, a range to a portion near a part of the intermediate layer 23 covered with the resist M is removed, and the curved projected shape of the side surface of the resist M is copied onto the first inner surface 23d, the second inner surface 23e, and the outer surface 23b, which are thereby formed to be curved in a projected shape. Next, as illustrated in FIG. 18(c), the resist M remaining on the intermediate layer 23 is stripped off, so that the first inner surface 23d, the second inner surface 23e, and the outer surface 23b having the shape described above can be obtained.

Figure 19:
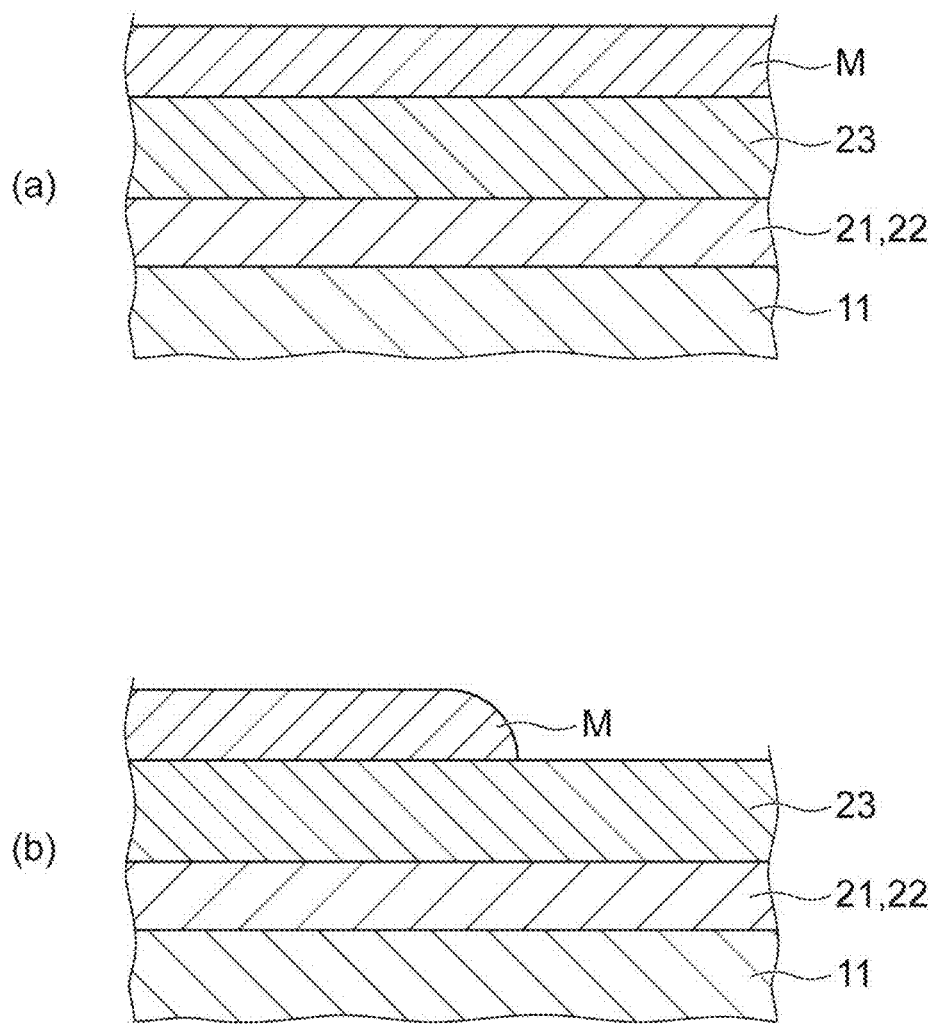
FIG. 19 is a view for describing the method of manufacturing the Fabry-Perot interference filter according to the modification example.
Figure 20:
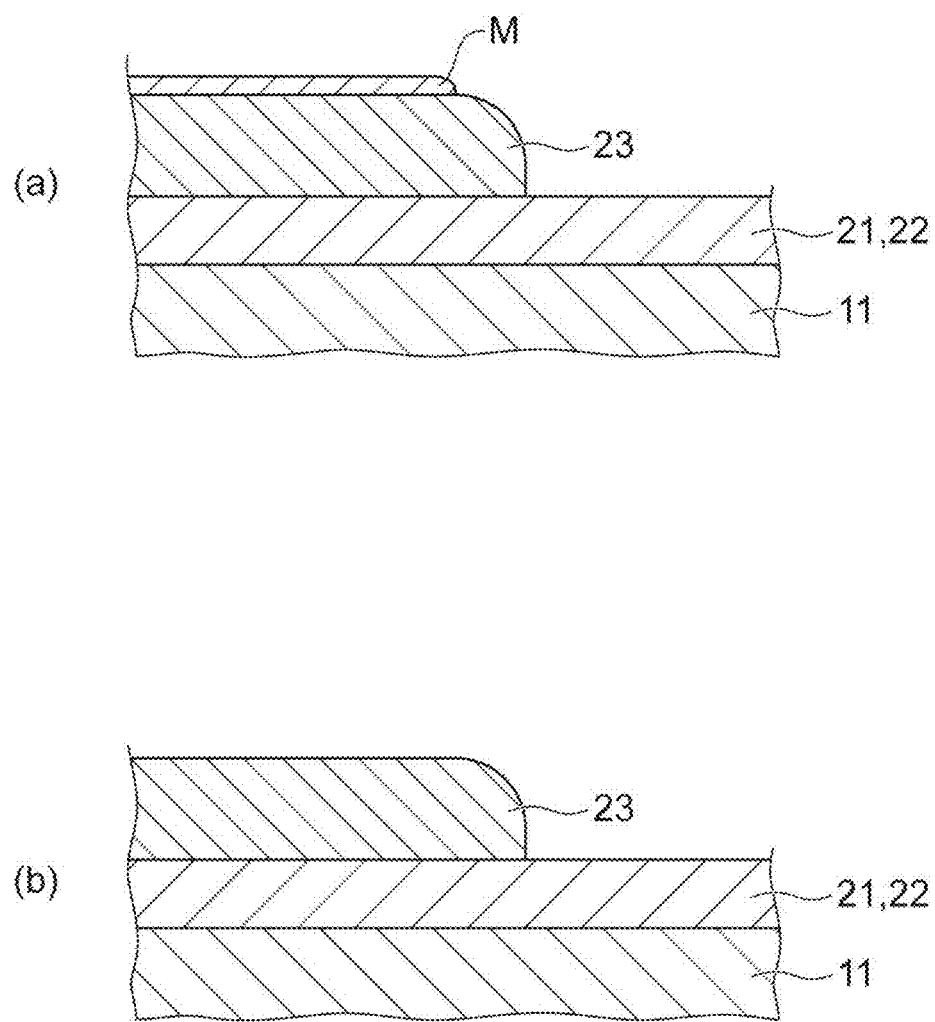
FIG. 20 is a view for describing the method of manufacturing the Fabry-Perot interference filter according to the modification example.

Alternatively, as a manufacturing method, in which the first inner surface 23d, the second inner surface 23e, and the outer surface 23b are formed to be curved in a projected shape in the second step, the following manufacturing method may be employed. First, as illustrated in FIG. 19(a), the resist M is applied over the intermediate layer 23. Next, as illustrated in FIG. 19(b), the resist M is subjected to exposure and development by using a 3D mask. Accordingly, the resist M is removed from a region corresponding to a region of the intermediate layer 23 to be removed, and a side surface of the resist M is formed to be curved in a projected shape. Next, as illustrated in FIG. 20(a), the intermediate layer 23 is removed through dry etching. Accordingly, a range to a part of the intermediate layer 23 covered with the resist M is removed, and the curved projection shape of the side surface of the resist M is copied onto the first inner surface 23d, the second inner surface 23e, and the outer surface 23b, which are thereby formed to be curved in a projected shape. Next, as illustrated in FIG. 20(b), the resist M remaining on the intermediate layer 23 is stripped off, so that the first inner surface 23d, the second inner surface 23e, and the outer surface 23b having the shape described above can be obtained.

In addition, as illustrated in FIGS. 21 to 24, the outer edge of the reflection prevention layer 21 and the outer edge of the first laminate 22 do not have to coincide with each other. In addition, the outer surface 22a of the first laminate 22 may be configured to be an intermittent surface, instead of a continuous surface. For example, the side surface 21a of the reflection prevention layer 21 may be positioned on the inner side (light transmission region 1a side) of the outer surface 22a of the first laminate 22. In this case, a part of the polysilicon layer 27a of the second laminate 24 enters the inside of a groove formed by the side surface 21a of the reflection prevention layer 21, a surface 22c of the first laminate 22 on the substrate 11 side, and the first surface 11a of the substrate 11. Accordingly, the second laminate 24 can be prevented from peeling.

Figure 21:
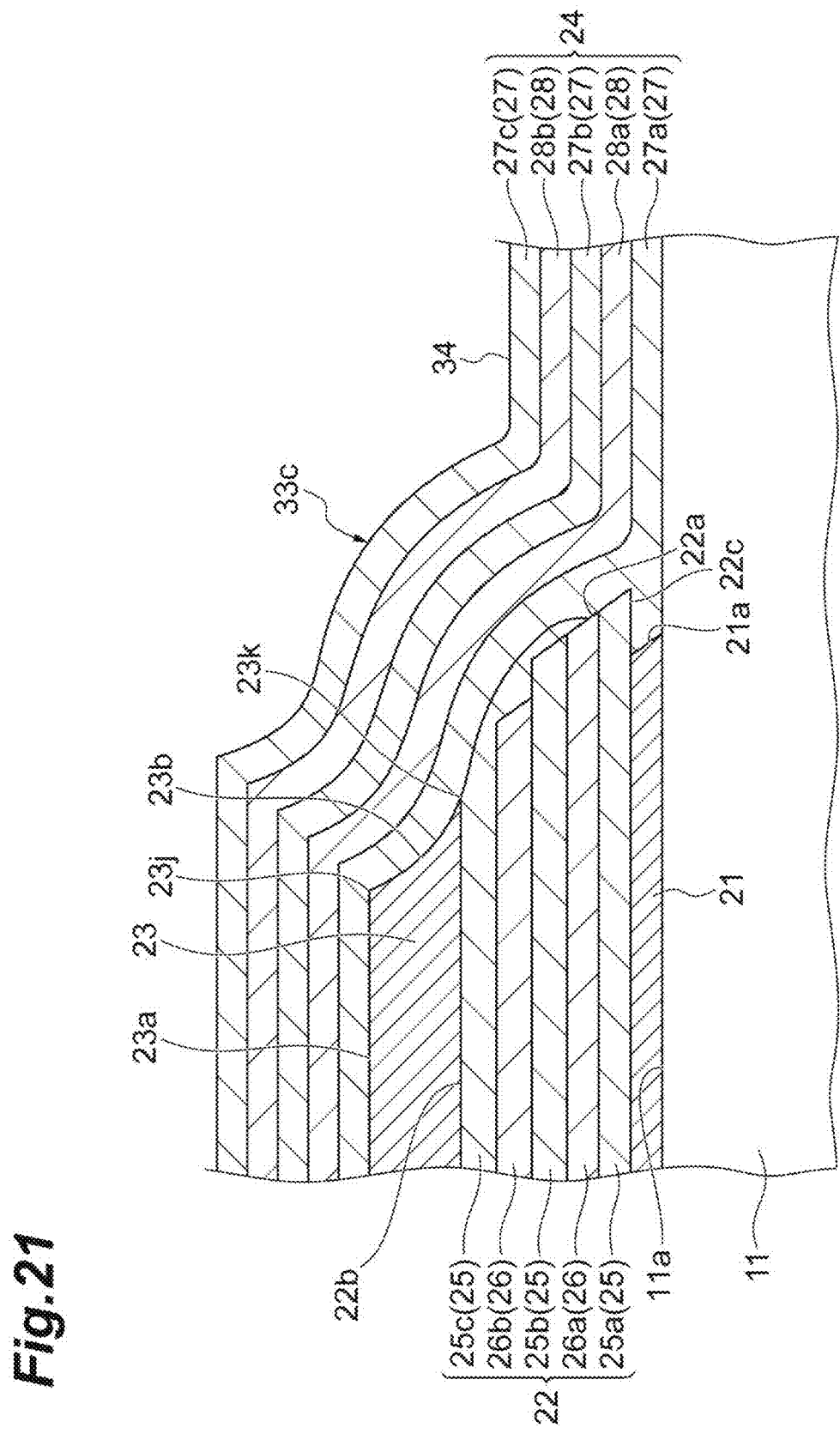
FIG. 21 is an enlarged cross-sectional view of the outer edge part of the Fabry-Perot interference filter according to the modification example.
Figure 22:
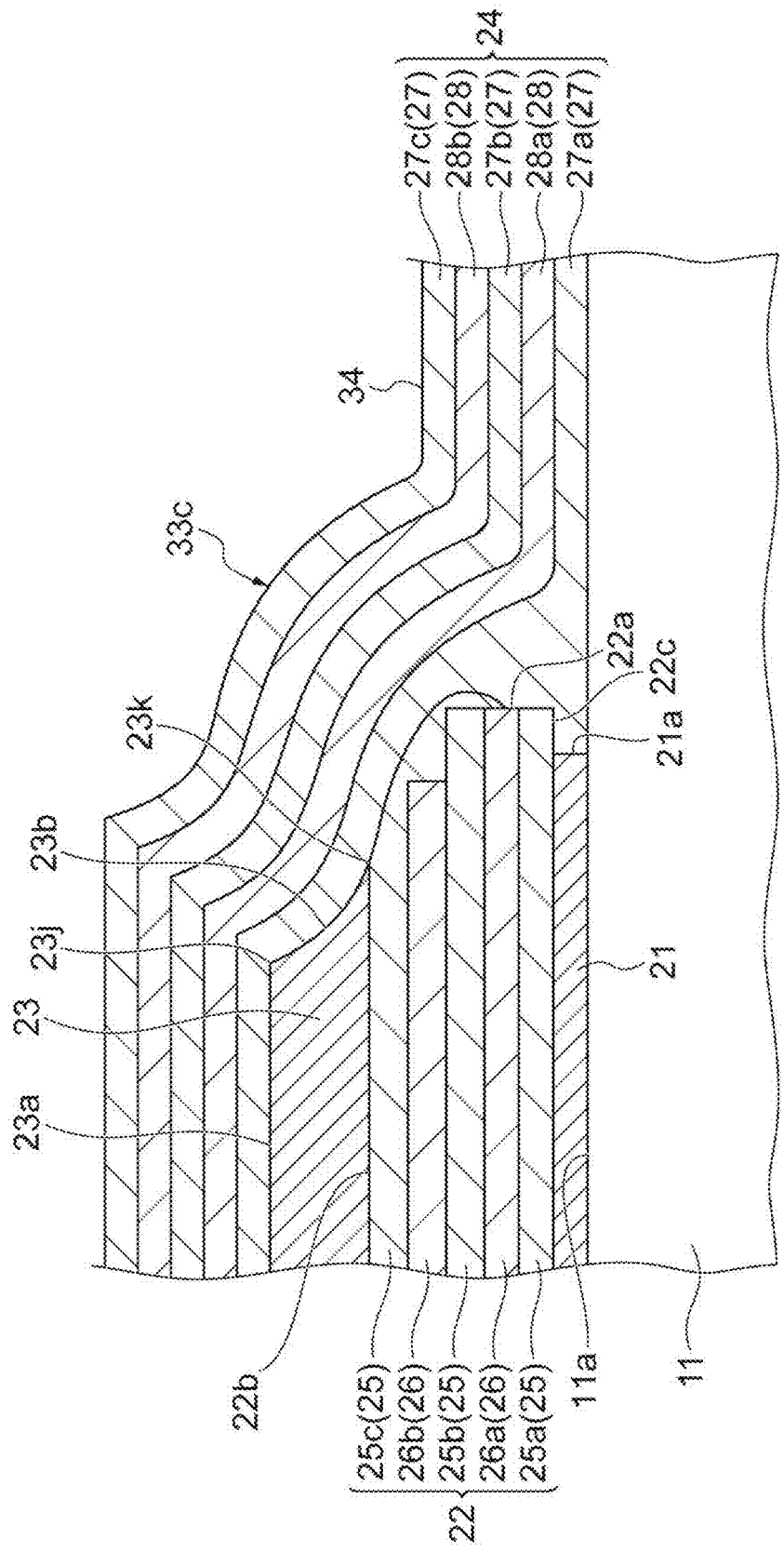
FIG. 22 is an enlarged cross-sectional view of the outer edge part of the Fabry-Perot interference filter according to the modification example.

In addition, as illustrated in FIGS. 21 and 22, an outer edge of the polysilicon layer 25c of the first laminate 22 may cover at least a part on an outer surface of a layer other than the polysilicon layer 25c of the layers configuring the first laminate 22.

In addition, as illustrated in FIGS. 21 and 22, an outer edge of a layer other than the polysilicon layer 25c of the layers configuring the first laminate 22 may exhibit an intermittent shape (for example, a stepped state). For example, an outer edge of the polysilicon layer 25b and an outer edge of the silicon nitride layer 26b do not have to coincide with each other. More specifically, an outer surface of the polysilicon layer 25b may be positioned on the outer side (on a side opposite to the light transmission region 1a)

of an outer surface of the silicon nitride layer 26b. Accordingly, the bonded area between the third covering portion 33c of the second laminate 24 and the outer surface 22a of the first laminate 22 increases, so that the second laminate 24 can be prevented from peeling.

As illustrated in FIG. 21, the outer surface of a layer other than the polysilicon layer 25c of the layers configuring the first laminate 22, and the side surface 21a of the reflection prevention layer 21 may exhibit a flat surface shape and may be inclined so as to be away from the light transmission region 1a in the direction parallel to the first surface 11a while becoming close to the substrate 11 in the direction perpendicular to the first surface 11a.

Alternatively, as illustrated in FIG. 22, the outer surface of a layer other than the polysilicon layer 25c of the layers configuring the first laminate 22, and the side surface 21a of the reflection prevention layer 21 may exhibit a flat surface shape and may be approximately orthogonal to the first surface 11a.

Figure 23:
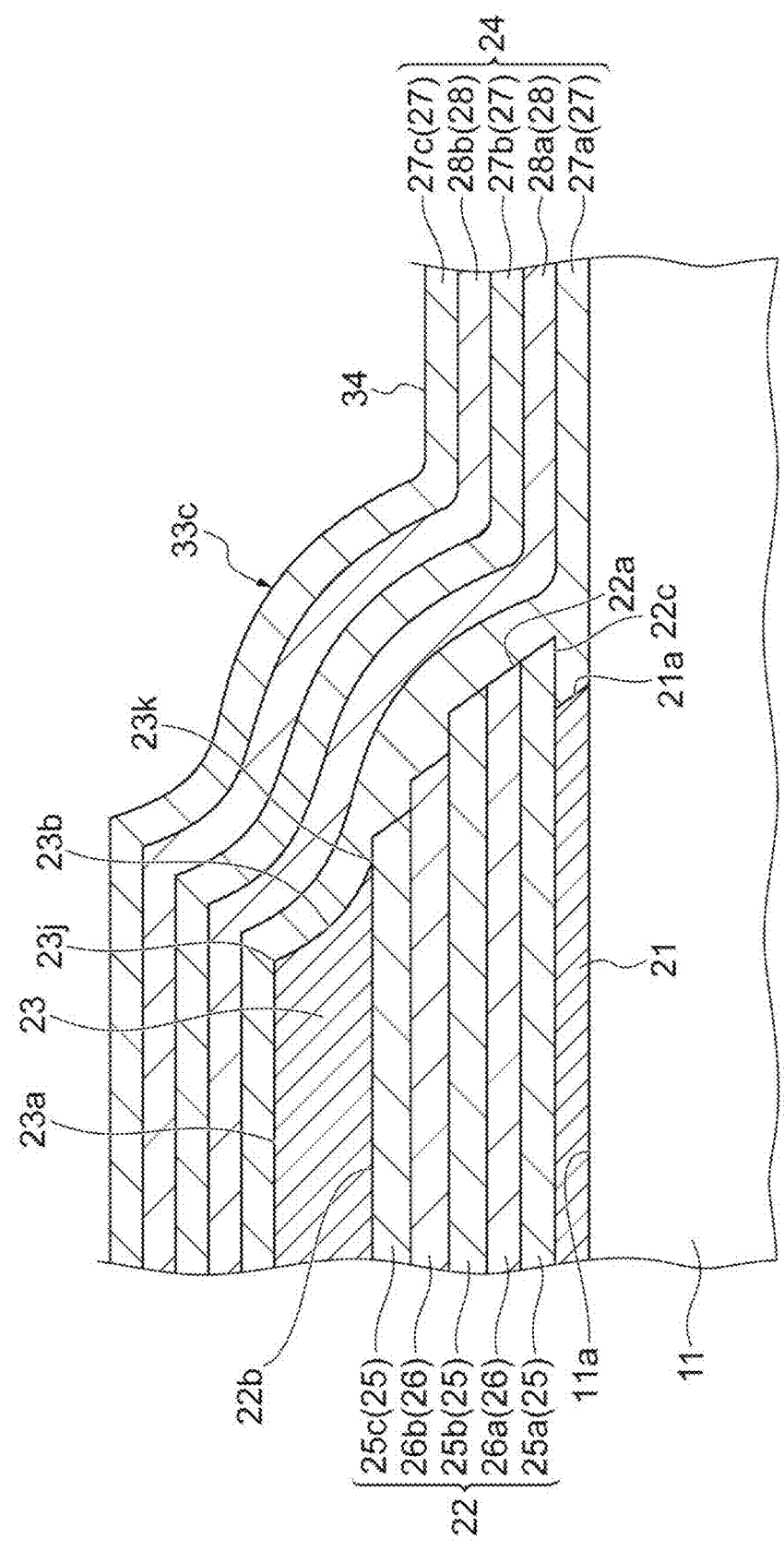
FIG. 23 is an enlarged cross-sectional view of the outer edge part of the Fabry-Perot interference filter according to the modification example.
Figure 24:
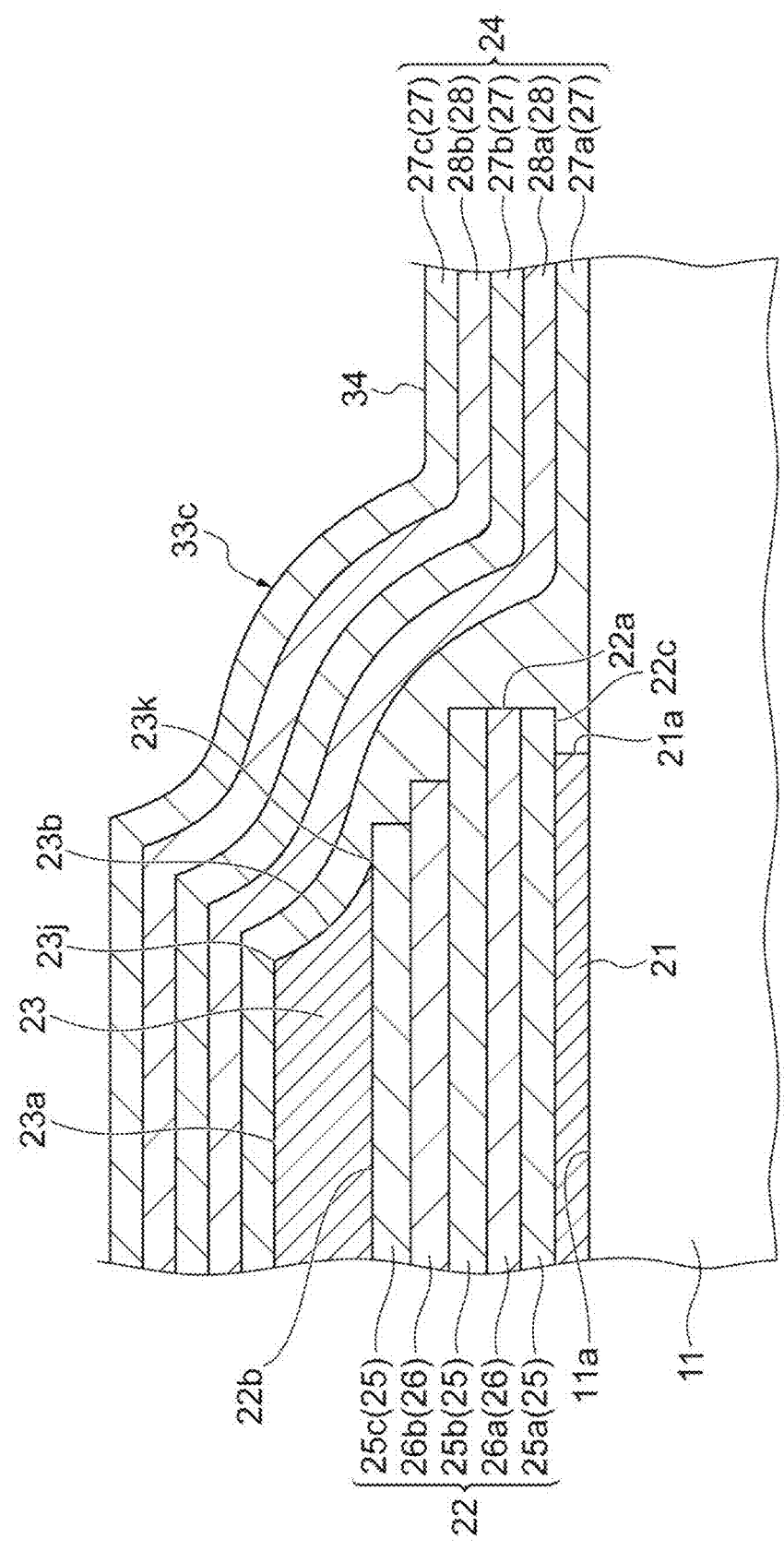
FIG. 24 is an enlarged cross-sectional view of the outer edge part of the Fabry-Perot interference filter according to the modification example.

In addition, as illustrated in FIGS. 23 and 24, in the first laminate 22, the outer edge of the polysilicon layer 25c may be positioned on the inner side of the outer edge of the silicon nitride layer 26b. In this case as well, the bonded area between the third covering portion 33c of the second laminate 24 and the outer surface 22a of the first laminate 22 increases, so that the second laminate 24 can be prevented from peeling.

In addition, the outer surface 22a of the first laminate 22 may be curved in a recessed shape on the gap S side. In other words, on the outer surface 22a, the angle of the outer surface 22a with respect to the first surface 11a may decrease while becoming close to the substrate 11 in the direction perpendicular to the first surface 11a. Alternatively, the outer surface 22a may exhibit a flat surface shape without being curved.

REFERENCE SIGNS LIST

1 Fabry-Perot interference filter
11 Substrate
11a First surface
22 First laminate (first layer)
22a Outer surface
23 Intermediate layer
23b Outer surface
23j, 23k Edge portion
24 Second laminate (second layer)
31 First mirror portion
32 Second mirror portion
42 Third laminate (third layer)
43 Intermediate layer (third layer)
44 Fourth laminate (third layer)
S Gap

The invention claimed is:

1. A Fabry-Perot interference filter comprising:
a substrate that has a first surface;
a first layer that has a first mirror portion disposed on the first surface;
a second layer that has a second mirror portion facing the first mirror portion via a gap on a side opposite to the substrate with respect to the first mirror portion; and
an intermediate layer that defines the gap between the first layer and the second layer,
wherein an outer surface of the intermediate layer is curved such that an edge portion of the intermediate layer on the substrate side is positioned on an outer side of an edge portion of the intermediate layer on the side opposite to the substrate in a direction parallel to the first surface, and
wherein the second layer covers the outer surface of the intermediate layer.

2. The Fabry-Perot interference filter according to claim 1,
wherein the outer surface of the intermediate layer is curved in a recessed shape on the gap side such that the edge portion of the intermediate layer on the substrate side is positioned on the outer side of the edge portion of the intermediate layer on the side opposite to the substrate in the direction parallel to the first surface.

3. The Fabry-Perot interference filter according to claim 1,
wherein the outer surface of the intermediate layer is curved so as to be away from the gap in the direction parallel to the first surface while becoming close to the substrate in a direction perpendicular to the first surface.

4. The Fabry-Perot interference filter according to claim 1,
wherein an outer surface of the first layer is positioned on the outer side of the outer surface of the intermediate layer in the direction parallel to the first surface, and
wherein the second layer covers the outer surface of the first layer.

5. The Fabry-Perot interference filter according to claim 4,
wherein the substrate has an outer edge portion positioned on the outer side of an outer edge of the first layer in a case of being seen in the direction perpendicular to the first surface, and
wherein the second layer covers the outer edge portion.

6. The Fabry-Perot interference filter according to claim 4,
wherein the outer surface of the first layer is curved so as to be away from the gap in the direction parallel to the first surface while becoming close to the substrate in the direction perpendicular to the first surface.

7. The Fabry-Perot interference filter according to claim 1, further comprising:
a third layer that is disposed on a second surface opposite to the first surface in the substrate.

* * * * *